United States Patent [19]

Demaray et al.

[11] Patent Number: 5,595,337
[45] Date of Patent: Jan. 21, 1997

[54] SPUTTERING DEVICE AND TARGET WITH COVER TO HOLD COOLING FLUID

[75] Inventors: Richard E. Demaray, Portola Valley; Manuel Herrera, San Mateo; David E. Berkstresser, Los Gatos, all of Calif.

[73] Assignee: Applied Materials, Inc., Santa Clara, Calif.

[21] Appl. No.: 460,954

[22] Filed: Jun. 5, 1995

Related U.S. Application Data

[62] Division of Ser. No. 157,763, Nov. 24, 1993, Pat. No. 5,433,835.
[51] Int. Cl.$^6$ .......................... B23K 20/00; B23K 20/22; C23C 14/34
[52] U.S. Cl. ........................ 228/193; 228/262.71
[58] Field of Search ............................. 228/193, 219, 228/221, 262.7, 262.71; 204/298.09, 298.12, 298.13

[56] References Cited

U.S. PATENT DOCUMENTS

| | | | |
|---|---|---|---|
| 3,630,881 | 12/1971 | Lester et al. | 204/298 |
| 3,956,093 | 5/1976 | McLeod | 204/192 |
| 4,100,055 | 7/1978 | Rainey | 204/298 |
| 4,116,806 | 9/1978 | Love et al. | 204/298 |
| 4,166,018 | 8/1979 | Chapin | 204/192 |
| 4,175,030 | 11/1979 | Love et al. | 204/298 |
| 4,318,796 | 3/1982 | Nishiyama et al. | 204/298 |
| 4,405,436 | 9/1983 | Kobayashi et al. | 204/298 |
| 4,430,190 | 2/1984 | Eilers et al. | 204/298 |
| 4,444,643 | 4/1984 | Garrett | 204/298 |
| 4,483,478 | 11/1984 | Schulz | 228/193 |
| 4,491,509 | 1/1985 | Krause | 204/192 |
| 4,500,409 | 2/1985 | Boys et al. | 204/298 |
| 4,564,435 | 1/1986 | Wickersham | 204/298 |
| 4,680,061 | 7/1987 | Lamont, Jr. | 148/1.5 |
| 4,714,536 | 12/1987 | Freeman et al. | 204/298 |
| 4,826,584 | 5/1989 | dos Santos Pereiro Ribeiro | 204/298 |
| 4,839,011 | 6/1988 | Ramalingam et al. | 204/192.38 |
| 4,904,362 | 2/1990 | Gaertner et al. | 204/192 |
| 4,978,437 | 12/1990 | Wirz | 204/192.23 |
| 5,096,562 | 3/1992 | Boozenny et al. | 204/298 |
| 5,130,005 | 7/1992 | Hurwitt et al. | 204/192 |
| 5,171,415 | 12/1992 | Miller et al. | 204/298 |
| 5,180,478 | 1/1993 | Hughes | 204/298 |
| 5,244,556 | 9/1993 | Inoue | 204/192.12 |
| 5,397,050 | 3/1995 | Mueller | 228/193 |

FOREIGN PATENT DOCUMENTS

| | | |
|---|---|---|
| 0590904 | 9/1993 | European Pat. Off. |
| 1147061 | 6/1989 | Japan |
| 63-270459 | 11/1989 | Japan |
| 3140464 | 6/1991 | Japan |
| 9312264 | 6/1993 | WIPO |

OTHER PUBLICATIONS

"Influence of Surface Preparation on the Diffusion Welding of High Strength Aluminum Alloys," Ed. D. J. Stephenson, published in *Diffusion Bonding 2*, pp. 101–110.

"Diffusion Bonding of Ti–6A1–4V Alloy: Metallurgical Aspects and Mechanical Properties," Ed. D. J. Stephenson, published in *Diffusion Bonding 2*, pp. 144–157.

Korman, et al., "Research Study of Diffusion Bonding of Refractory Materials, Columbium and Tantalum," *Army Materials and Mechanics Research Center*, Nov. 10, 1967, pp. 1–27.

(List continued on next page.)

*Primary Examiner*—Samuel M. Heinrich
*Attorney, Agent, or Firm*—Janis Biksa

[57] ABSTRACT

A target, target backing plate, and cover plate form a target plate assembly. The sputtering target assembly includes an integral cooling passage. A series of grooves are constructed in either the target backing plate or the target backing cooling cover plate, which are then securely bonded to one another. The sputtering target can be a single monolith with a target backing plate or can be securely attached to the target backing plate by one of any number of conventional bonding methods. Tantalum to titanium, titanium to titanium and aluminum to titanium, diffusion bonding can be used.

3 Claims, 18 Drawing Sheets

OTHER PUBLICATIONS

S. Pineau, et al., "The Investigation and Production of Titanium–Tantalum Junctions Diffusion Bonded at High Temperature (855° C. to 920° C.), etc.," *Royal Aerospace Establishment*, Library Translation 2180, Jan. 1990, pp. 3–34.

Article—The Review of Scientific Documents, vol. 44, No. 4, by Charles Terhune, pp. 522–523, Apr. 1973.

English Language Summary of Japan 62–2980367 (Nov. 17, 1987), "target for Sputering with Cooling Member", vol. 13, No. 384, (C–629), Aug. 24, 1989.

SPUTTERING DEVICE AND TARGET WITH COVER TO HOLD COOLING FLUID

This application is a Divisional Application of prior U.S. application Ser. No. 08/157,763, filed on Nov. 24, 1993, now U.S. Pat. No. 5,433,835.

FIELD OF THE INVENTION

This invention relates to planar magnetron sputtering targets and more specifically to a structure and method for cooling the sputtering target and a structure and method for holding such a target being cooled.

BACKGROUND OF THE INVENTION

Sputtering describes a number of physical techniques commonly used in, for example, the semiconductor industry for the deposition of thin films of various metals such as aluminum, aluminum alloys, refractory metal silicides, gold, copper, titanium-tungsten, tungsten, molybdenum, tantalum and less commonly silicon dioxide and silicon on an item (a substrate), for example a wafer or glass plate being processed. In general, the techniques involve producing a gas plasma of ionized inert gas "particles" (atoms or molecules) by using an electrical field in an evacuated chamber. The ionized particles are then directed toward a "target" and collide with it. As a result of the collisions, free atoms or groups of ionized atoms of the target material are released from the surface of the target, essentially converting the target material to its gas phase. Most of the free atoms which escape the target surface condense and form (deposit) a thin film on the surface of the object (e.g. wafer, substrate) being processed, which is located a relatively short distance from the target.

One common sputtering technique is magnetron sputtering. When processing wafers using magnetron sputtering, a magnetic field is used to concentrate sputtering action in the region of the magnetic field so that sputtering occurs at a higher rate and at a lower process pressure. The target itself is electrically biased with respect to the wafer and chamber, and functions as a cathode. Objectives in engineering the cathode and its associated a magnetic field source include uniform erosion of the target and uniform deposition of pure target material on the wafer being processed. During sputtering, if magnets generating a magnetic field are stationary at a location, then continuous sputtering consumes the sputtering target thickness at that location quickly and generates hot spots at the locations of sputtering. To avoid contaminating the process, sputtering is stopped before the non-uniform sputtering wear pattern has consumed the full thickness of the target material at any point. If any point on the target plate behind the target were to be reached, sputtering of the target backing plate material (often copper) would occur, contaminating the vacuum chamber and the wafer being processed with the target backing material (copper). Because of the non-uniform pattern of target utilization, conventionally sputtering is usually stopped when a large percentage of the target still remains.

As the target erodes, the distance between the target surface (which is eroding away) and the substrate being sputtered is slowly increasing. The change in the distance between the target surface and the substrate being sputtered creates a change in the qualities of the sputtered material deposited and its uniformity. When large areas such as glass plates are being deposited, variations in the thickness of deposited sputtered material are measurable and, may be unacceptable if the change in the target thickness detrimentally affects the deposition of the target material on the substrate being deposited.

In generating the gas plasma and creating ion streams impacting on the cathode, considerable energy is used. This energy must be dissipated to avoid melting or nearly melting the structures and components involved. Common techniques used for cooling sputtering targets are shown in FIGS. 1 and 2. One technique as used by many prior art sputtering devices is to pass water or other cooling liquid through a fixed internal passage of the sputtering target. As shown in FIG. 2, a first opening such as a hose 35 supplies water or other cooling liquid to a target backing plate 33 where it passes through cavities or passages of the backing plate and out a second hose 36. The target 34 is therefore cooled. To complete the picture of FIG. 2, the sputtering chamber 30 includes a object substrate support structure 32 on which the substrate to be deposited 31 rests. In this configuration the sputtering target is completely immersed in the process environment. A water-to-vacuum seal is often needed to prevent the water or other cooling liquid from leaking out of its passages. A magnetron sputtering cathode as described by Carlos dos Santos Pereiro Ribeiro in his U.S. Pat. No. 4,826,584 for a magnetron sputtering cathode is typical of the prior art showing cooling line attachments hidden behind the sputtering target and attached to the back of the target to pass liquid through structures adjacent to the target. While a magnet is not shown in FIG. 2, commonly these devices have stationary or rotating magnets to assist in directing the ion flow and controlling the primary sputtering location.

Another technique which is commonly used which has eliminated the vacuum-to-water seal problem is shown in FIG. 1. A processing chamber 20 supports a sputtering table 26 supporting substrate 25 to be sputter coated in close proximity to a target 24. The sputtering chamber 20 includes a circumferential top flange on which a target assembly 22 rests. The target assembly 22 consisting of a target backing plate 23 and the target 24 completely covers the flange of the processing chamber 20 and a seal is made between the processing chamber and outside ambient air at the flange surface. A cooling chamber 21 encloses the top of the target assembly 22. A stationary magnet or a magnet moving through a path as depicted by the dashed lines. 28 is located closely adjacent to the back of the target backing plate 23. The magnet 27 as it is moved in a magnet sweep path by a magnet sweep mechanism (not shown) causes the movable magnet 27 to move in the magnet sweep zone as shown by the dashed lines 28 together with the magnet 27. The magnet and portions of the magnet sweep mechanism, in this configuration, are immersed in cooling liquid which is circulated through the chamber behind the target to ensure cooling of the target.

In these configurations the target backing plate 23 is subjected to a strong vacuum pressure on the processing side (less than 1 torr) with a positive pressure of as much as several atmospheres on the cooling side. The actual pressure on the cooling side depends on the volume of coolant needed to cool the target and the diameter of the piping, through which it needs to move to provide enough cooling to maintain acceptable temperatures on the sputtering target. To avoid short-circuiting the flow of coolant through the chamber (from the inlet immediately by the shortest path to the discharge), often distribution manifolds or flow directing restrictions are placed in the path of the coolant to minimize short-circuiting and maximize cooling.

The weight of the water or other cooling liquid in the cooling chamber must also be supported by the target backing plate and target. To obtain maximum thermal conduction between the cooling liquid and the target backing plate, it is necessary that the flow regime in the cooling chamber 21 be such that any fluid boundary layer formed at and near the back of the target backing plate 23 be minimized or eliminated. Therefore, laminar cooling flow is not sufficient, the flow must be in the turbulent range to maximize heat transfer between the fluid target and the fluid. Higher fluid pressures are needed to generate the fluid velocities required for turbulent flow resulting in higher pressures in the cooling chamber 21.

For small sputtering targets, the target backing plate and target can be built to be quite massive to resist deflections due to the differential pressures between the vacuum and the processing chamber 20 and the ambient air pressure plus fluid pressure in the cooling chamber 21. When the size of the target and target backing plate become large because the area to be coated is quite large, as might be done for a flat glass panel to be used in a flat panel display of a computer or television screen, the thickness of the target and target backing plate must be substantially increased to avoid unacceptable deflections. When a magnetron is used, sputtering is most effective when the magnets are just behind the surface of the sputtering target. Increasing the distance between the surface of the sputtering target and any magnets used for magnetron sputtering behind the target (by increasing target thickness) substantially decreases the effect of the magnets on sputtering, or conversely, much more powerful magnets need to be used in order to be sure that the magnet field is effective through the thickness of the target and its backing plate.

The deflection of the target and target backing plate under the differential pressure between the processing chamber and the cooling chamber causes the target and target backing plate to bow substantially. Many targets are attached to their target backing plates using a relative ineffective soldering or brazing technique. The bowing of the target backing plate and target creates an enormous stress in the solder or brazing material, or in the target material if it is softer, such that the probability of delamination or separation of the target from the target backing plate is greatly increased. In instances where solder or low temperature brazing has been used, a separation between the target and target backing plate at one point acts as a nucleus for a propagating defect. Once a pinhole surface defect forms, hot process gases can and often do find their way into such pinhole surface openings to progressively melt the solder and brazing compounds located there. When sufficient melting and/or separation has occurred, the target will actually drop off the target backing plate, ruining the process and requiring complete replacement of the target, if not a complete cleaning of the process chamber.

Methods that have been used in the past to attempt to overcome these difficulties include explosion bonding, friction welding or roll bonding of the target to its backing plate. In these processes there is a large non-uniform thermal or mechanical gradient to which the target and target backing plate are subjected. The microstructure of the various pieces is affected by the stress induced by thermal gradients or mechanical deflections and the dimensions of the pieces change. Subsequent processing (machining and or thermal stress reduction techniques) must often be used to arrive at a target-target backing plate assembly that is dimensionally stable without warpage under the thermal cycling of sputtering.

The disadvantages of the existing sputtering target systems as described above continue to inhibit the wide use of sputtering as an efficient and cost-effective means for applying surface coatings.

SUMMARY OF THE INVENTION

This invention relates to an improved configuration for a sputtering target and sputtering target backing plate. This configuration overcomes many of the drawbacks of the previous configurations and provides a structure and method to improve sputtering coverage and sputter large areas such as glass plates. In particular, large targets are required when stationary, full coverage deposition is required with high film quality for large substrates.

The new configuration includes a processing chamber having a top circumferential flange surface. A sputtering target assembly is supported on the flange. The target assembly includes a target separate or integral with a target backing plate. In a monolithic (integral) configuration the target (e.g. aluminum and its alloys) and target backing plate can be a single piece of material into which O-ring grooves and other fixtures are machined to seal with the process chamber. In other instances the target material is separate from the target backing plate and is secured to the target backing plate using one of several commonly known joining techniques such as soldering, welding, or brazing. Additional techniques for joining the target to the target backing plate according to this invention include bonding the target to its backing plate by use of diffusion bonding, by filler-metal, solid state, or liquid phase diffusion bonds.

A cooling cover plate is firmly attached (bonded) to the back (top) of the target backing plate. The cooling cover plate must be tightly joined with the back of the target backing plate so that a tight seal is created for the cooling fluid. The cooling cover plate has cavities or grooves therein which provide a path for cooling fluid in which to flow. The cooling fluid cavities or grooves are configured in such a way as to distribute the cooling liquid flow over a substantial area of the target backing plate so as to provide a maximum cooling or heating effect over the whole plate. The grooves are machined or cast into the side of the cooling cover plate facing the target backing plate. The grooves or cavities have intermediate fins or walls. When the ends of these fins or groove walls are secured to the backing plate, they help maintain the dimensions of the cooling passages over the wide span of the cooling cover plate. In this way cooling fluid pressure in the cooling passages does not cause bowing of the cooling cover plate or the target and its target backing plate.

The cooling cover plate can be joined to the target backing plate by any reliable means. However, it has been found that in order to reliably join the ends of the fins or intermediate walls of the cooling passage cavities or grooves to the target backing plate, it is necessary to provide a strong bond such as achieved by using a structural type adhesive, diffusion bonding, or brazing. It is important that the coefficient of thermal expansion of the target backing plate and its cover be closely matched. If not closely matched, then the shear stress associated with differential thermal expansion between the pieces causes bond failure. The differential strain between the target backing plate and a cooling cover plate of different materials, can be minimized by using pins at intermediate locations across the field between the edges of the plates. Screws or bolts at intermediate locations can also establish and assure that de-bonding does not take place.

When using a structural type adhesive such as a nitrile epoxy adhesive, the surfaces to be bonded are cleaned and treated (roughened) to improve the adherence of the nitrile epoxy. The adhesive is precisely located on its respective bonding surfaces by being attached to a carrying screen or mesh. In accordance with good workmanship practices, the adhesive is placed on the mesh only at those locations corresponding to places between the cover plate and target backing plate where joining (bonding) is desired. The target backing plate and cooling cover plate are then pressed against each other with a predetermined pressure and heated to a predetermined temperature to assure the bonding of the pieces. Once the nitrile epoxy has set, a very strong bond is created between the cooling cover plate and the target backing plate such that differential pressures of several atmospheres can be applied without failure of the epoxy bond.

The cooling cover plate can also be joined to the target backing plate using diffusion bonding techniques as discussed below for bonding a separate target material to its backing plate.

The cooling cover plate can also be a cast (formed) in place prepreg unit. Wax or other material with a low melting point can be formed into the shape (pattern) of the desired cooling flow passages on the back of the target backing plate. A fluid dam formed around the edge of the plate retains a casting material, such as prepreg—a castable structural epoxy that can be reinforced with various forms, tapes and fabrics (e.g., aramid fiber, glass, nylon, etc.) poured over the backing plate to form the cooling passages and insulate the target within the edges of the plate. Once the castable material sets, openings are made to the fluid passage and the assembly is heated to above the melting (or fluidizing) temperature of the pattern material so that the wax (or other pattern material) can be removed leaving cooling fluid passages in the shape of the pattern.

Alternately, cooling water passages and grooves can also be provided in the target backing plate. The cooling cover plate is then a flat piece to bond over the cooling passages in the target backing plate.

The target, target backing plate, and cooling cover plate make up a target assembly which is placed over the sputtering chamber. When the target assembly is made in a configuration with a rigid cross section or reinforced to minimize bending, sputtering can take place while the target carries the load of the differential pressure between ambient conditions and the vacuum of the processing chamber. Alternatively, a top chamber, enclosing a magnet can be put in position and sealed to the top of the target assembly. When sputtering is desired the pressures in both the sputtering chamber and the top chamber are reduced substantially and nearly equally. The target assembly then acts as a diaphragm separating two chambers of nearly equal pressure. The cooling fluid flowing through the cooling passages in the target assembly is isolated from both of the vacuum chambers. The strong bond between the target backing plate and the fins of the cooling cover plate reduces, if not completely eliminates, the deflection of the target assembly and target due to cooling fluid pressures.

A magnet sweeping mechanism placed in the dry top chamber does not need to overcome the resistance of fluid as it would if it were immersed in fluid. Further, since the target assembly is acting as a diaphragm sealing two chambers of nearly identical pressure, the target assembly can be made very thin to decrease the distance of the magnets from the target face.

The target assembly, in its present target size of 510 mm×600 mm, however, does not require the top chamber to be under vacuum for the system to operate properly because the deflecting loads due to vacuum from the process-side chamber are small and the coolant loads are all internal to the target assembly.

Many types of high-intensity magnets reduce their magnetic field strength at elevated temperatures. Using a configuration according to this invention, unlike previous configurations where the magnets are immersed in the hot cooling fluid, the magnets' temperature increases very little, if at all, due to the sputtering process. The magnets are located in the top evacuated chamber and there is virtually no heat flow to the magnets by conduction and heat flow from the target assembly to the magnets by radiation will be quite minuscule as the cooling cover plate face of the target assembly will have a maximum temperature substantially identical with that of the average cooling fluid temperature, e.g. 50° C. At such temperatures, radiation heat transfer is negligible. In addition, because the target assembly is electrically charged, an electrical insulating sheet is often placed over and bonded to the backside of the cooling cover plate. This further reduces any heat transfer from the target assembly to the magnets.

The electrically charged target assembly should be isolated from the sputtering process chamber and the top chamber as well as from operator contact. Insulating rings placed above, below and outside of the target assembly provide such insulation. A high purity water or other cooling fluid is used so that there is a negligible current loss through the cooling passages. An insulating hose is used to connect to the cooling/heating fluid source(s).

The cooling fluid inlet and outlet flows can be routed through a plastic (acrylic, polycarbonate, etc.) manifold, or hose fittings with quick disconnect type fittings may be attached directly to the target backing plate. The plastic manifold is bolted to the target backing plate and provides insulation, preventing an operator from contacting the highly energized target plate through this path. Power is provided to the target plate through a power connection opening. In one configuration, a safety power connector fitting connects electrical power to the target plate only when a vacuum is pulled in the top chamber. The top chamber vacuum urges the safety connector to overcome an elastic barrier to make a tight electrical connection with the target backing plate.

A power connection for the target plate also contributes to the safety of the processing operation. An insulated power connector is attached to a hole in the cover plate. At ambient conditions a gap between the energized conductors and outer surfaces of the conductor insulates operators from the energized portion of the connector. However when the top chamber with the power connector in place is depressurized by pulling a vacuum, the elastic force separating the energized pieces from the connection to the target contacts is overcome creating a good connection.

In the configuration as described, very large substrates to be coated can be deposited from targets having sizes substantially equal to the size of the substrates. For instance, large glass panel displays as might be used for large television-like screens whose dimensions are as much as two or three feet in any direction could be deposited from the sputtering target and sputtering chambers as described herein. Further, when conventional movable magnets are used behind the target assembly in a sweep pattern that erodes the target irregularly. The pressures in the two chambers may be adjusted to control the bow in the target assembly, thereby mechanically adjusting the distance between the target surface and the substrate to be sputtered so that the uniformity of deposition is maintained even when the sputtering target is nearing the end of its useful life. Also, since the pressures in the two chambers can be adjusted to control the bow of the target assembly, the same target thickness and magnet field strength can be employed in sputtering systems using substantially larger substrates or glass panels.

In this configuration all vacuum-to-water seals have been eliminated and failure of any seals will not have a catastrophic effect on the process or the target.

When the target and target backing plate are separate and need to be joined, there is always concern about the bond between the target and the target backing plate under the locally high temperatures of the process. Diffusion bonding, a technique sometimes used in the aircraft industry to join and guarantee the bonding of critical parts, can be used to bond various target materials to various backing plates such that a failure of the bond in some areas will not cause propagation of the de-lamination over the whole target as happens now with prior art soldering or brazing techniques. For sputtering it is sufficient that the target face be held generally parallel with the face of the substrate being sputtered and that there initially be in excess of 70% contact (bonding) between the target and the target backing plate to provide a satisfactory electrical and thermal connection between the two to adequately dissipate the thermal energy delivered to the target plate by the process.

Diffusion bonding provides a gentle method of joining of the target to the target plate. Bonding by diffusion permits dimensional stability and bonding reliability while avoiding thermally or mechanically induced stresses due to localized gradients when explosive bonding, friction welding or roll bonding are performed. Also, diffusion bonding can be employed to bond the cooling cover plate to the backing plate at the same time that the target has been bonded to the target backing plate. Various diffusion recipes are identified to bond tantalum to titanium-based materials, titanium targets to titanium, or tantalum to aluminum (and its alloys).

In some cases, preparation of a target assembly using diffusion bonding consists of diffusion bonding the target to the target backing plate. Once the target backing plate is bonded to the target then the target backing plate is bonded to the cooling cover plate using the structural epoxies. In this step, an insulating sheet of glass epoxy laminate (e.g., G-11/FR4) can be bonded over the cooling cover plate, or it may be bonded over the cooling cover plate at a later time.

In other cases, the cooling cover plate and insulating sheet of glass epoxy laminate are formed by a single cast operation using a composite prepreg product, as previously described.

Machining to final dimensions is done once final bonding is complete.

BRIEF DESCRIPTION OF THE DRAWINGS

FIG. 4 is bottom view of a target assembly with screw holes around the cooling passage inlet and outlet openings according to the invention;

FIG. 5 is a cross-sectional view of FIG. 4 taken at 5—5;

FIG. 6 is a cross-sectional view of FIG. 4 taken at 6—6;

DETAILED DESCRIPTION

An embodiment according to this invention provides a cooling passage sealed within a sputtering target assembly. The target assembly is sealed to a vacuum processing chamber. Cooling fluid flowing through the cooling passages provides cooling to a sputtering target assembly in an efficient manner and avoids water-to-vacuum sealing problems. The target assembly is sealed between two vacuum chambers so as to obtain a predetermined low stress deformation in the target assembly.

Figure 1:
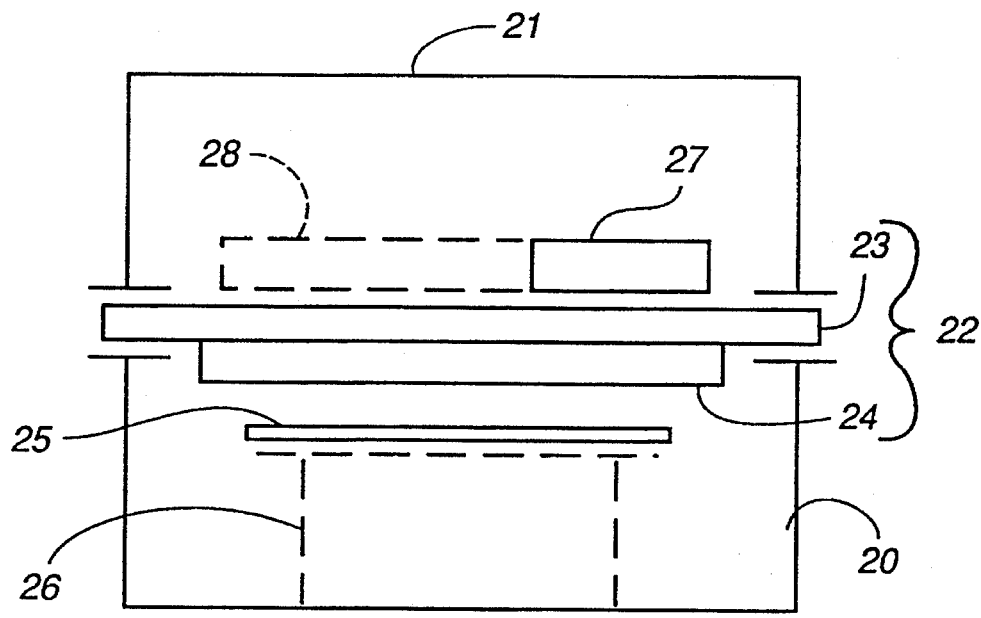
FIG. 1 is a cross-sectional view of a prior art sputtering chamber separated from a cooling chamber by a target assembly.
Figure 2:
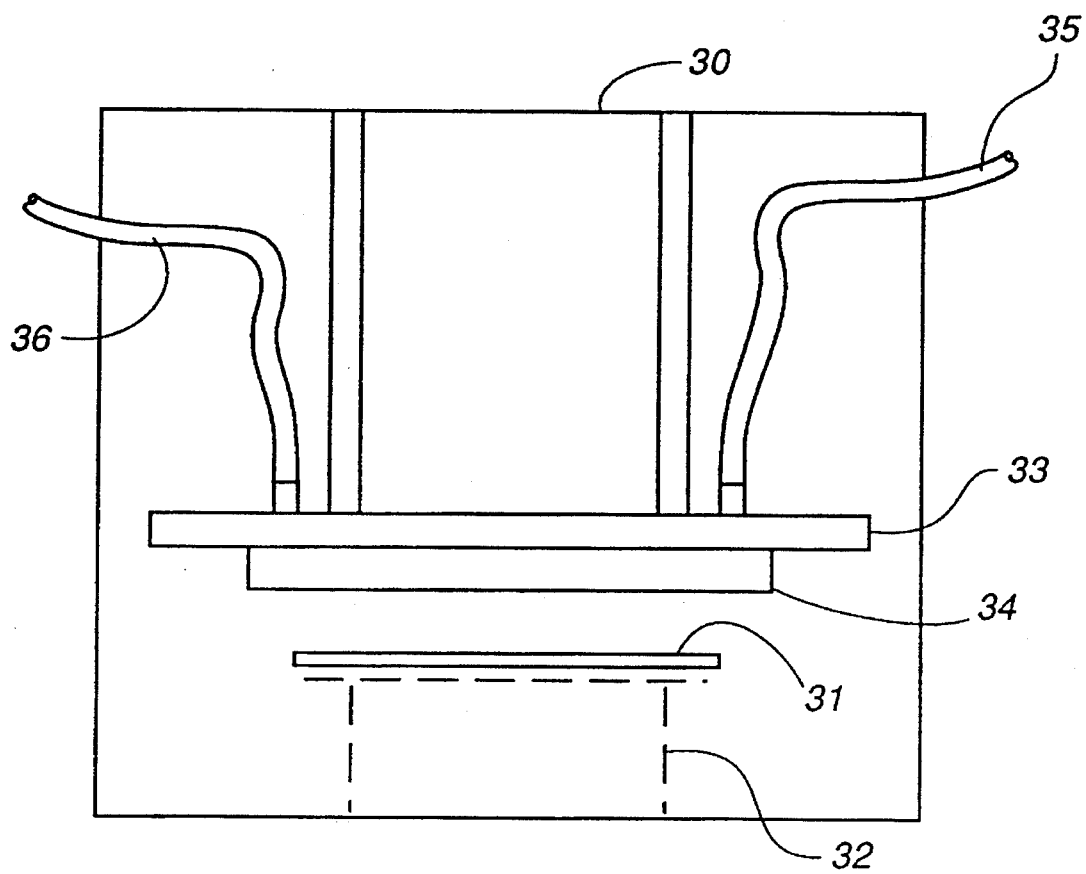
FIG. 2 is a cross-sectional view of a prior art sputtering chamber wherein the target and target assembly are immersed within the processing chamber and cooling fluid is provided to the target through seals in the wall of the processing chamber.
Figure 3:
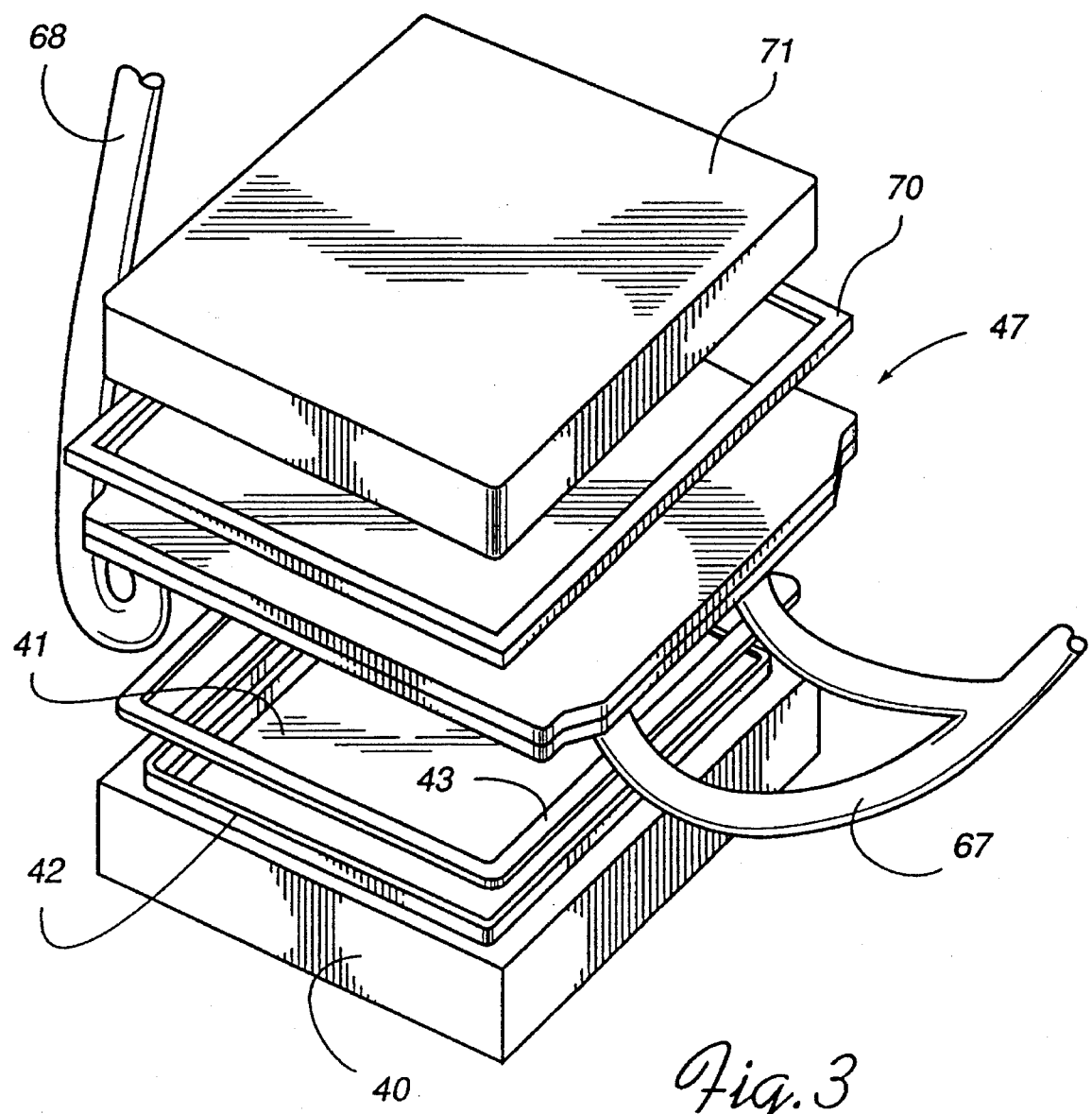
FIG. 3 is an exploded view of an embodiment according to the invention.

A general configuration of an embodiment according to the invention is shown in FIG. 3. A processing/sputtering chamber 40 encloses a substrate 41 to be sputter coated. The substrate 41 is surrounded by a dark space ring 42 to prevent deposition of material from beyond the edge of the sputtering target. A lower insulating ring 43 rests on the top flange of the processing sputtering chamber 40. A laminated target assembly 47 is located on the lower insulating ring 43. Inlet and outlet cooling lines 67,68 provide cooling liquid to the target assembly 47. An upper insulating ring 70 insulates the top chamber 71 from the target assembly 47.

This general configuration as shown in FIG. 3 provides the basis for specific embodiments of the invention as described below.

Figure 4A:
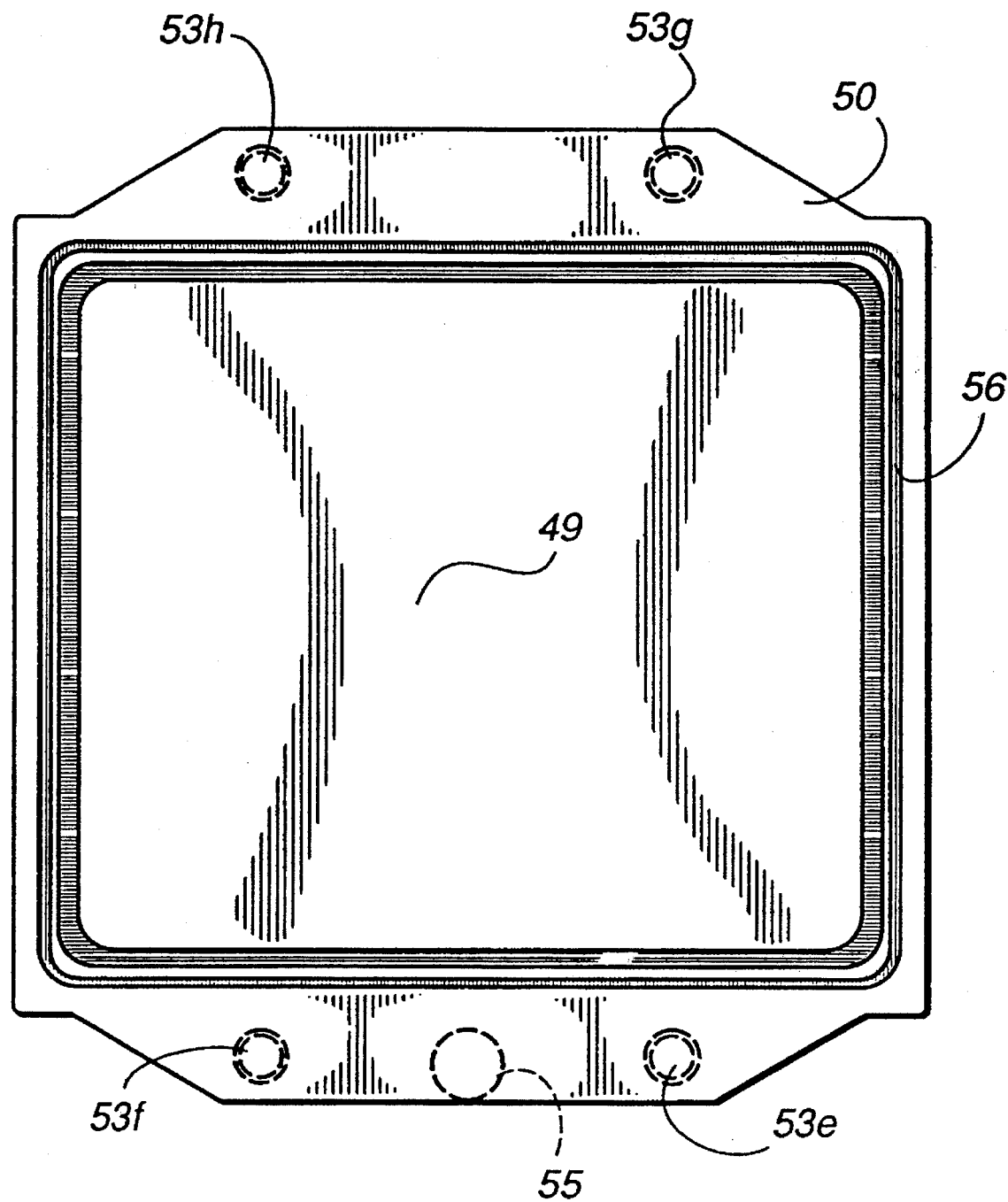
FIG. 4A is bottom view of a target assembly where the cooling passage inlet and outlet openings are threaded and configured to receive cooling fluid hose fittings according to the invention.
Figures 4, 5, 6:
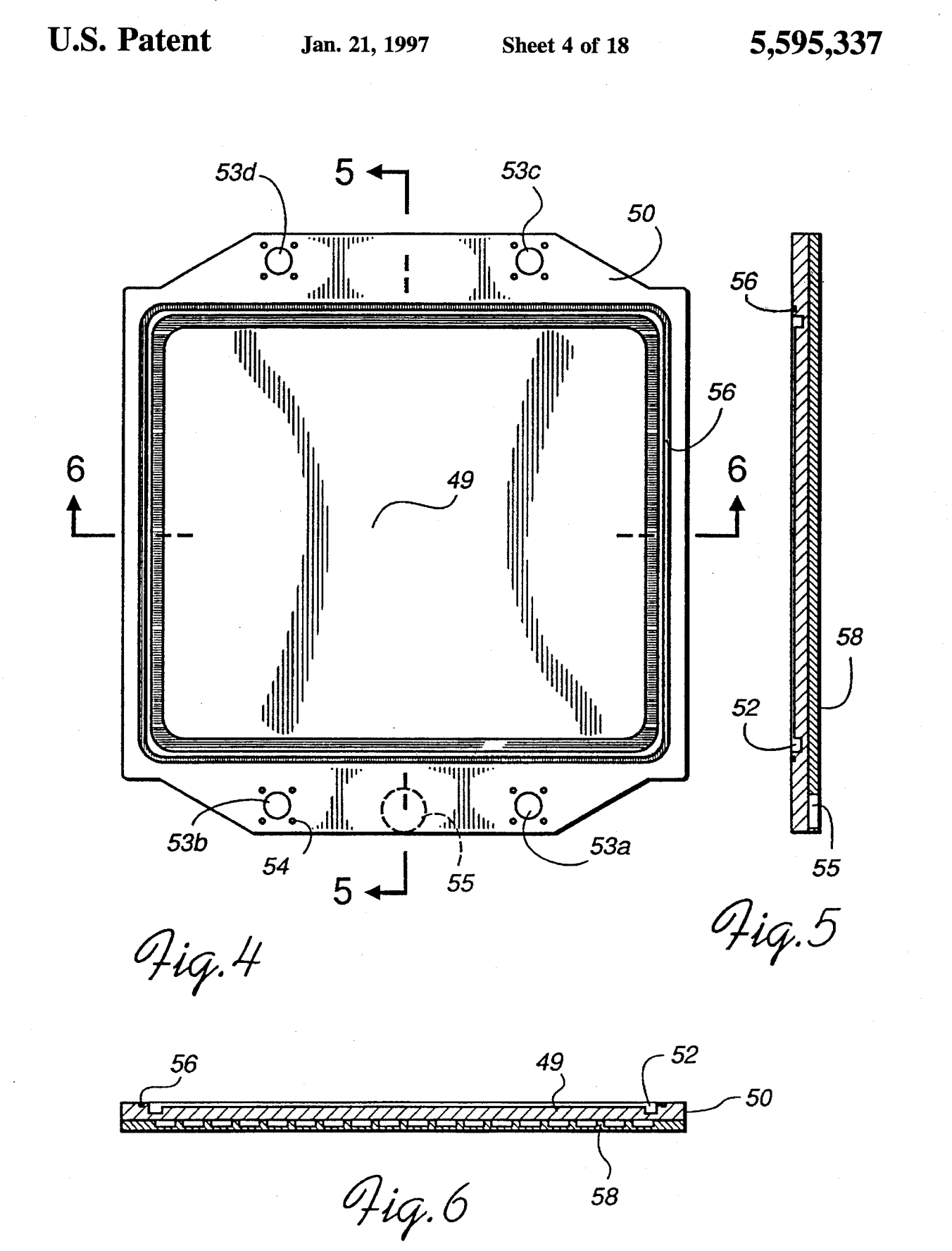
Figure 7A:
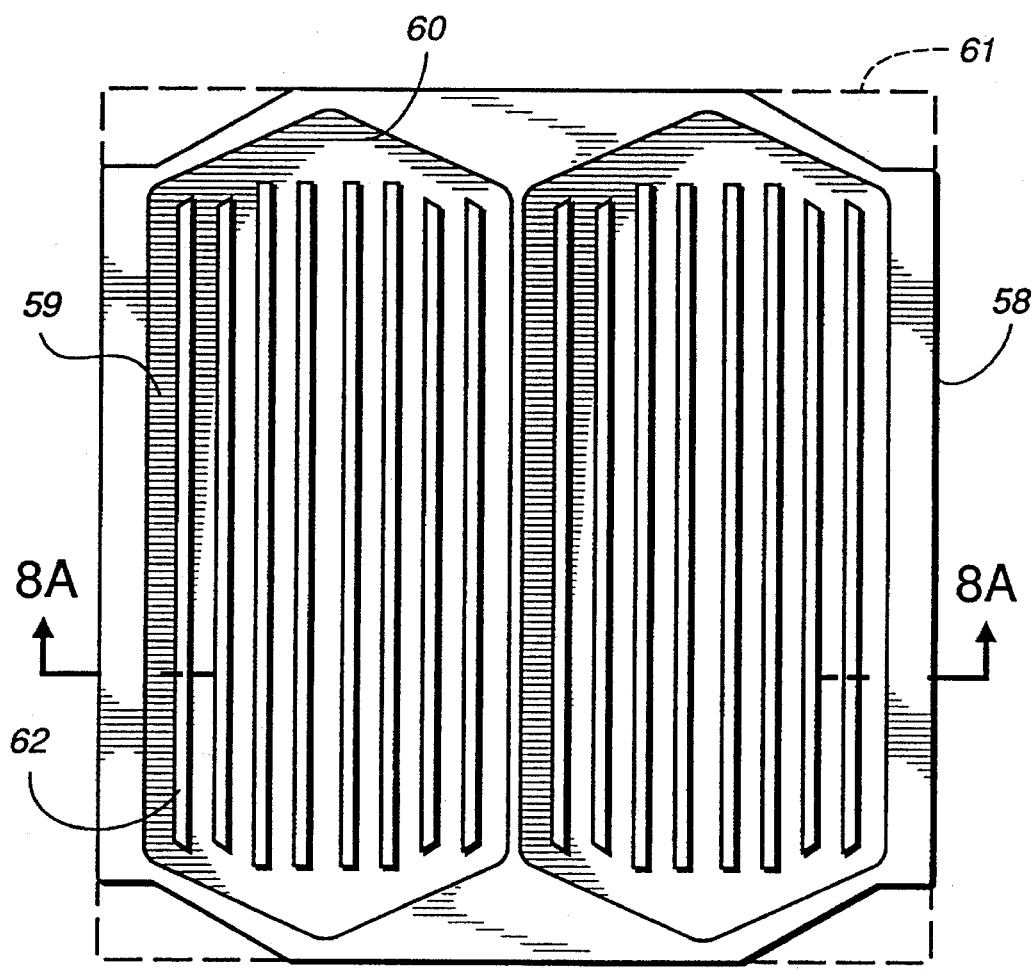
FIG. 7A is a bottom view of a cooling cover plate having generally equal sized cooling grooves according to the invention.
Figure 10A:
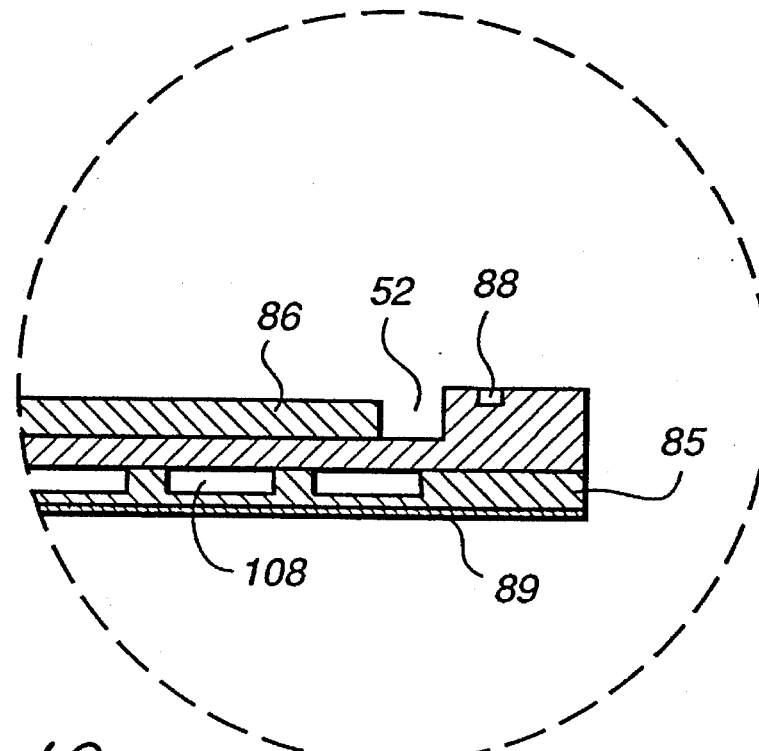
FIGS. 10A and 10C show detailed cross-sectional views of target assembly where the target material is separate from the target backing plate, according to the invention.

FIG. 4 shows a bottom view of the target assembly 47. FIGS. 5 and 6 are cross sectional side views. The target 49 comprising the material to be sputtered is centrally located in the target backing plate 50. The target 49 and target backing plate 50 may be constructed of a single monolithic material, such as aluminum or titanium or the target material may be different from the target backing material, in which case the target material 49 must be securely attached to the target backing plate 50. Cross-sectional side views of an edge of a separate target 86 and target backing plate 87 is shown in FIG. 10A.

A dark space ring groove 52 is provided around the target 49 (FIG. 6). When the target and target backing plate are a monolith this groove 52 is machined (or cast) into the plate. When the target 86 and target backing plate 87 are different materials (FIG. 10A), the distance between the edges of the two pieces provides this groove. An O-ring sealing groove 56 (88 in FIG. 10) is provided outside the dark space ring groove 52 to contain an O-ring (not shown) to seal the target backing plate to the sputtering/processing chamber 40.

Figure 8A:
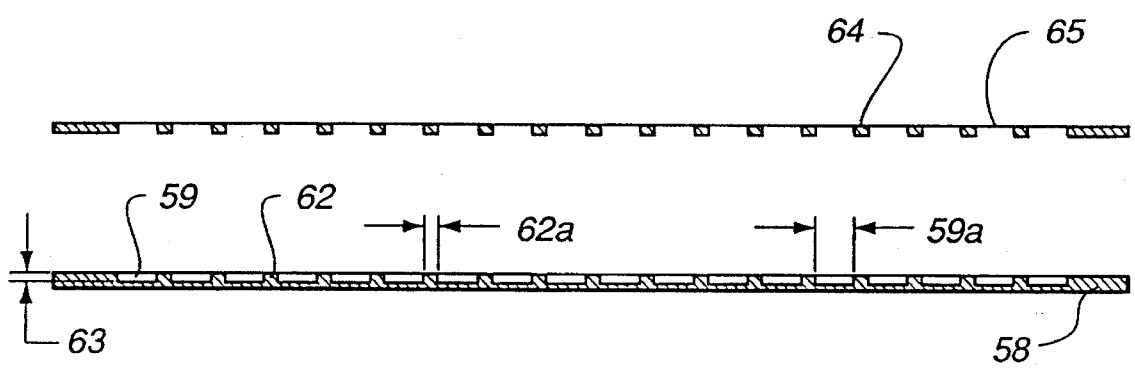
FIG. 8A shows a cross-section of FIG. 7A cut at 8A—8A and a cross-section of a bonding adhesive attached to a mesh for bonding the cover plate to a target backing plate according to the invention.

A cooling cover plate 58 (FIGS. 5, 6, 7A and 8A) is laminated to the back side of the target backing plate 50. This cooling cover plate 58 has a series of grooves 59 machined, cast or formed-by other means into its face. When its grooved side is to be securely attached (bonded) to the back of the target backing plate 50, as illustrated in FIG. 8A using a structural type epoxy adhesive 64 suspended on a mesh 65, the structural epoxy is suspended on a mesh 65 similar to the mesh in a silk screening process. The pattern of the suspended epoxy matches pattern of the flat surface at the top of the walls 62 separating the grooves 59 forming the cooling fluid passages in the cooling cover plate. After the epoxy has been applied to the top of the walls 62, the cooling cover plate 58 is pressed to the target backing plate 50.

In one configuration the cooling cover plate 58 has a thickness of 0.425 in. (10.8 mm) wherein the groove width 59a is 1.000 in. (25.4 mm) and the groove depth 63 is 0.25 in. (6.4 mm) while the wall thickness between grooves 62a is 0.375 in. (9.5 mm). A series of coolant distribution collection areas 60 in the cooling cover plate 58 (FIG. 7) distribute and collect the cooling fluid received from the cooling inlet 53a, 53b and route fluid to the outlet 53c, 53d connection holes in the target backing plate of FIG. 4. The configuration of the walls and grooves in the cooling cover plate can be adjusted so that at a predetermined flow rate and temperature there will be an approximately even mass flow velocity in each groove as there is in its adjoining groove, thereby preventing or reducing the problem of short circuiting and hot spots in areas of the target assembly where fluid flow is stagnant or nearly so. Also, the configuration of the walls and grooves in the cooling cover plate can be adjusted so that more coolant flow can be directed to areas of maximum erosion of the target material as shown in FIGS. 7B and 8B.

Figure 7B:
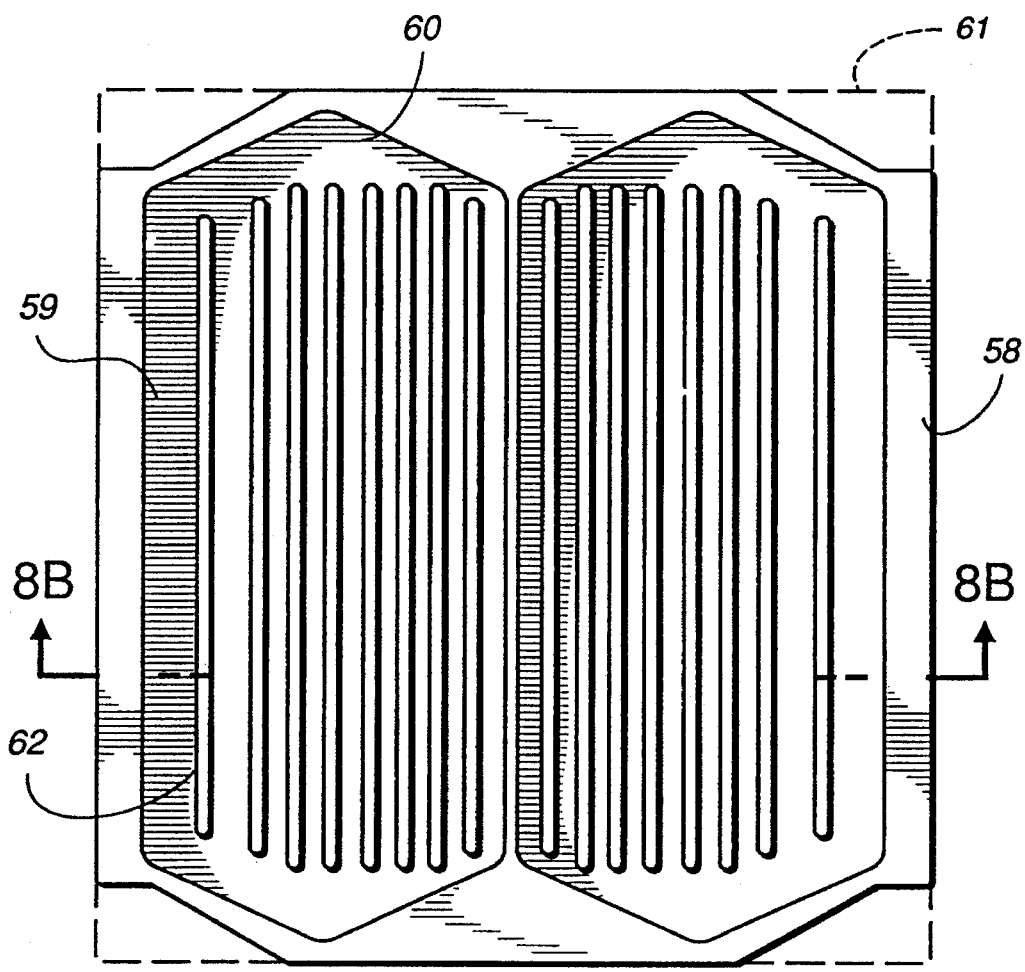
FIG. 7B is a bottom view of a cooling cover plate having cooling grooves with unequal dimensions and spacing according to the invention.
Figure 8B:
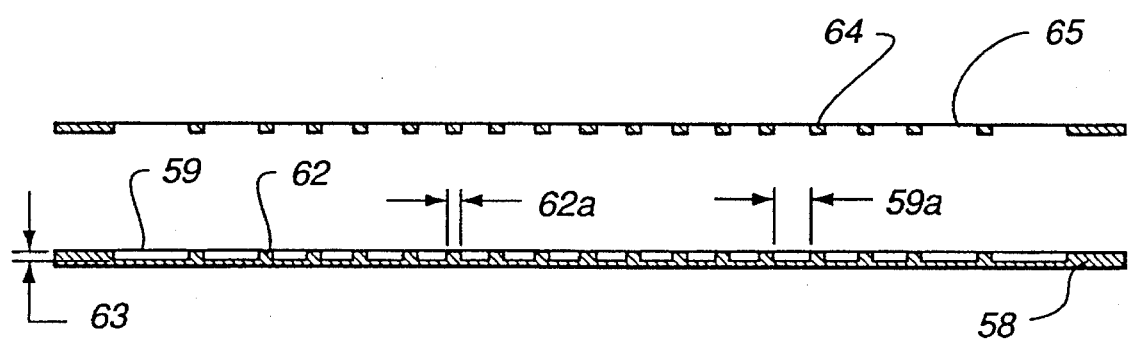
FIG. 8B shows a cross-section of FIG. 7B cut at 8B—8B and a cross-section of a bonding adhesive attached to a mesh for bonding the cover plate to a target backing plate according to the invention.

In the configuration as shown in the FIGS. 7B and 8B the distance between cooling groove walls has been adjusted to reduce the cooling flow near the center of the plate (since two sets of separate passages are shown the narrower grooves appear along the centerline of the plate, but at the medial edge of each of these passages).

Figure 7C:
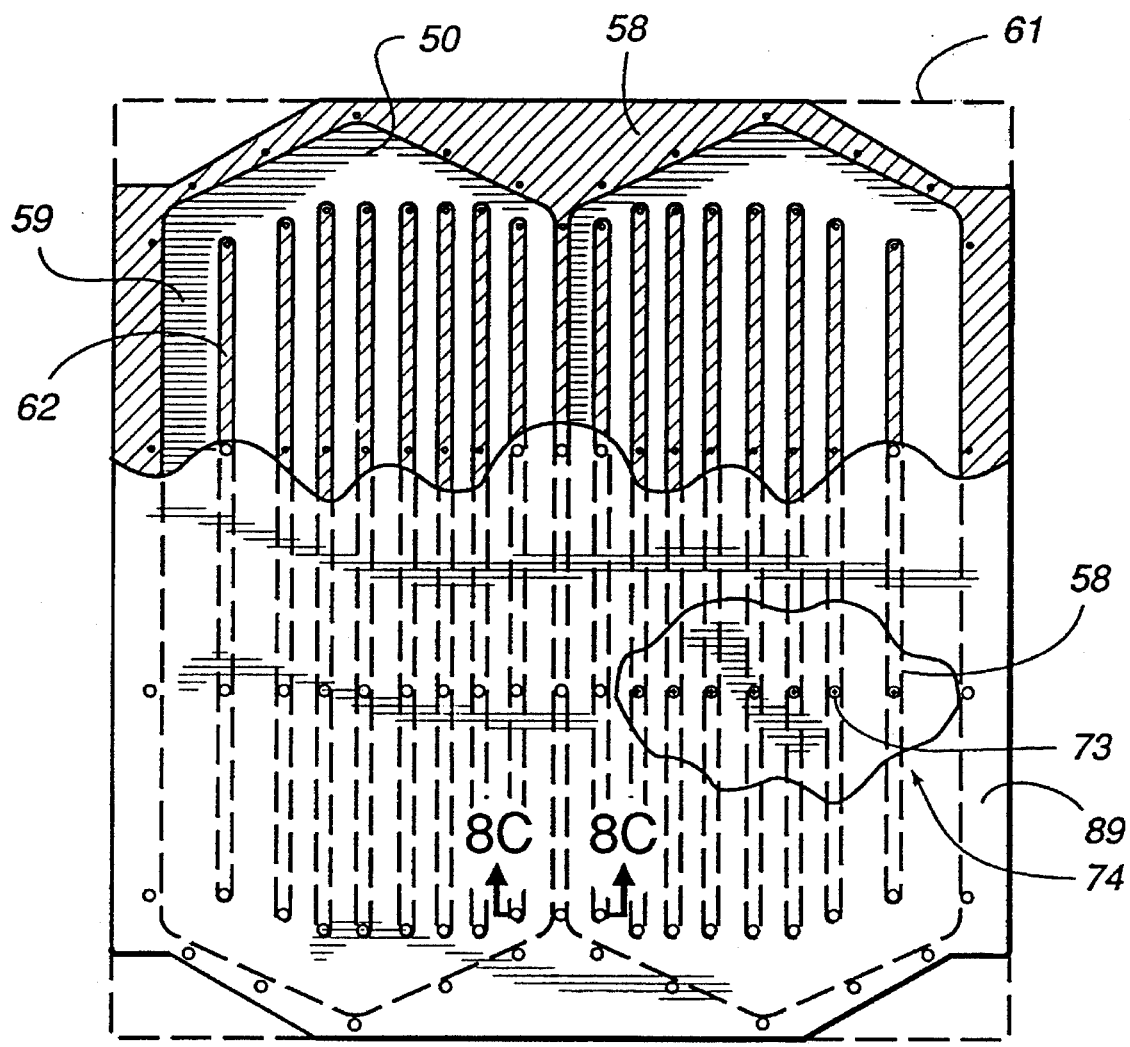
FIG. 7C is a bottom view of a cooling cover plate having mechanical fastening aids according to the invention.
Figure 8C:
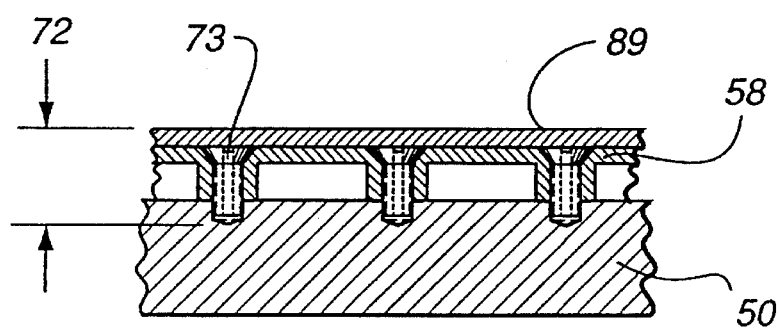
FIG. 8C shows a cross-section of FIG. 7C cut at 8C—8C and a cross-section of a bonding adhesive attached to a mesh for bonding the cover plate to a target backing plate according to the invention.

In the configuration as shown in FIGS. 7C and 8C, the bonding of the cooling cover plate 58 is reinforced by pins or screws 73 which extend only a short distance 72 into the target backing plate 50. An insulating glass laminate 89 covers the top of pins or screw head 73. The hole pattern of the screws 73 is shown in FIG. 7C. The polygon 74 shows a cut-away of the glass laminate covering the screw heads. FIG. 8C shows a cross-sectional view of an example of the pin or screw 73 connections.

In the configurations as shown cooling flow rates of 5 gallons per minute at inlet coolant (e.g., water) temperatures of 122° F. (50° C.) appear to give acceptable cooling performance.

The solid outline of the cooling cover 58 can be simplified by using a rectangular plate whose corner might be configured as shown for example by the dashed line 61.

An acceptable application of the structural epoxy (nitrile epoxy, nitrile phenolic, modified epoxy, and phenolic epoxy)is the use of nitrile epoxy in a 0.013 in. (0.33 mm) thick "FM 300-2K" film adhesive with knit carrier by American Cyanamid Company; Bloomingdale Plant, Havre de Grace, Md., which comes in a sheet-like form attached to a reinforcing/carrying mesh 65. The adhesive on the mesh (knit) backing is located on and pressed to the target backing plate 50 with a pressure of 20±5 psi (0.14±0.03 MPa) the temperature of all pieces is raised to 250°±5° F. (120°±3° C.) over 30 minutes. The 250° F. (120° C.) temperature is then maintained for 90 minutes during which curing of the bond takes place. Air cooling is then allowed. For superior results when bonding with FM 300-2K and its parent FM 300 (–M or –K) adhesives, curing pressures in an Autoclave (e.g., a heated nitrogen-pressurized chamber) should be set to 50±10 psi while holding at a curing temperature of 350° F. (177° C.) for 90 minutes. These adhesives can be obtained under various trade names from several U.S. manufacturers and are currently being used, for example, to bond the structural member of landing gears and cargo floors for commercial aircraft.

When reinforcement of the bonding adhesive is desired, corresponding holes can be made in the cooling cover plate and target backing plate (FIGS. 7C and 8C). Press fit pins or screws put into the holes to prevent differential movement between the pieces. The holes through the cooling cover plate are made through the fins (groove walls) so that the cooling passages remain clear and are not distorted.

On final machining a power connection hole 55 (FIGS. 4 and 5) is machined into the cooling cover plate 58 and through the nitrile epoxy bond to be sure that when electrical power is applied to the target it reaches the target backing plate 58 without undue resistance. Similarly, the cooling inlet and outlet features 53a, 53b, 53c, 53d are finish machined once the bonding is complete. Care is taken not to breach both pieces.

In one configuration (FIG. 4) screw holes around the cooling openings 54 provide the means to attach cooling fluid inlet manifolds or hoses to the target assembly. An example of general hose routing is shown by the hoses 67 and. 68 in FIG. 3. In another configuration (FIG. 4A) threaded hose-barb fittings are mounted directly to features 53e, 53f, 53g, 53h. Non-drip type quick disconnect fittings can be assembled to the other end of the hoses.

Figure 9:
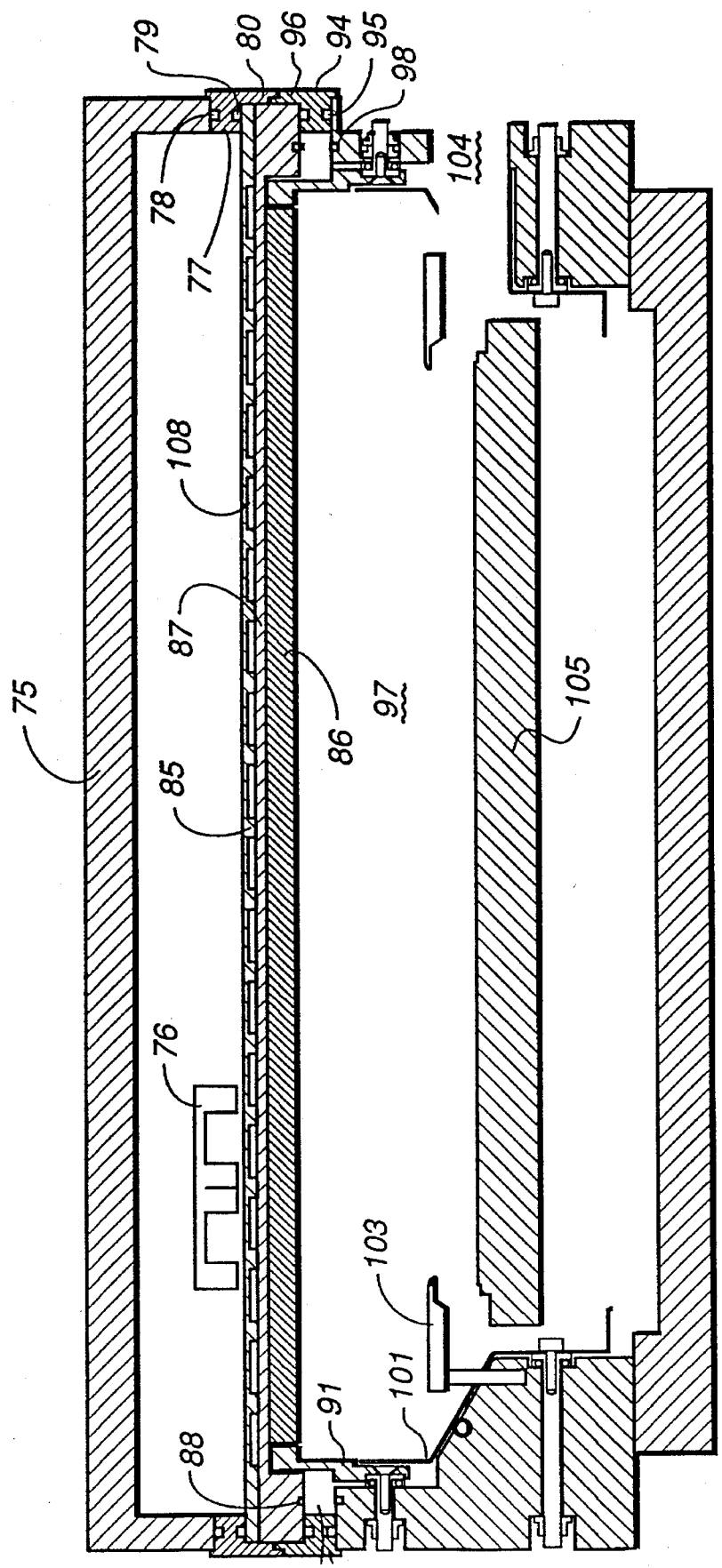
FIG. 9 is a cross-sectional view of a sputtering device according to the invention showing a target assembly having a cooling cover plate with grooves therein according to the invention.

A clear understanding of the details of an embodiment according to the invention can be shown by reviewing the cross-section of a sputtering device as shown in FIG. 9. The sputtering/processing chamber 97 is accessed through a slit valve 104 such that a substrate to be deposited (not shown) is delivered to a sputtering pedestal 105. The sputtering pedestal 105, being movable, is then moved vertically into position by vertical adjustment means (not shown) opposite the sputter target 86. A shadow frame 103 covers the outside edge of the substrate to prevent deposition on its edge. The sputtering/processing chamber 97 is lined with an overspray shield or chamber liner 101. This liner 101 is more easily removed and cleaned than the chamber internal surfaces. The sputtering/processing chamber 97 has a top flange O-ring groove 98 to contain a sealing O-ring (not shown). An insulating ring, e.g. a ceramic (alumina) ring 92 (similar to item 43 shown in FIG. 3) rests on the top flange of the processing chamber 97. An outer insulator 93 having a lower O-ring groove 95, an upper O-ring groove 94, and an upward projecting insulating skirt 96 surrounds the ceramic insulator 92. O-rings preferably made of Viton (not shown) are disposed in these grooves. The outer insulator 93 slightly overlaps the outside corner of the processing chamber upper flange. This slight overlap precisely locates the outer insulator 93 as well as the ceramic insulator 92 on the upper flange of the processing chamber 97. A dark space shield 91 is located inside the ceramic insulator 92 and projects upwardly towards the target backing plate 87.

The target assembly in this embodiment according to the invention includes a target 86, a target backing plate 87 and a backing plate cooling cover 85 having cooling grooves 108 therein. This target assembly has a target backing plate O-ring groove 88 to seal against ceramic insulator 92 using an O-ring (e.g. Viton) (not shown). The upward projecting skirt 96 of the outer insulator 93 along with the upward projecting dark space shield 91 locates the target assembly on the processing chamber 97.

Once the target assembly is in position, an upper insulator 77 having a lower O-ring groove 79 and an upper O-ring groove 78 both having O-rings (not shown) rests on the top of the target assembly, specifically on the back of the backing plate cooling cover 85. The back of the cover plate 85 may be covered by a thin sheet of insulating material such as G11 glass epoxy laminate (not shown in FIG. 9). Because the target assembly is highly energized during processing, it is necessary to completely cover it and to insulate it from grounding by being touched by an operator or another piece of processing equipment. Therefore the upper insulator 77 has a downward projecting insulating skirt 80 which overlaps the upward projecting insulating skirt 96 of the outer insulator 93 thereby providing a complete cover around the edge of the target assembly. The outer insulator 93 and the upper insulator 77 can be constructed of a variety of plastics, for example, acrylic or polycarbonate.

Figure 9A:
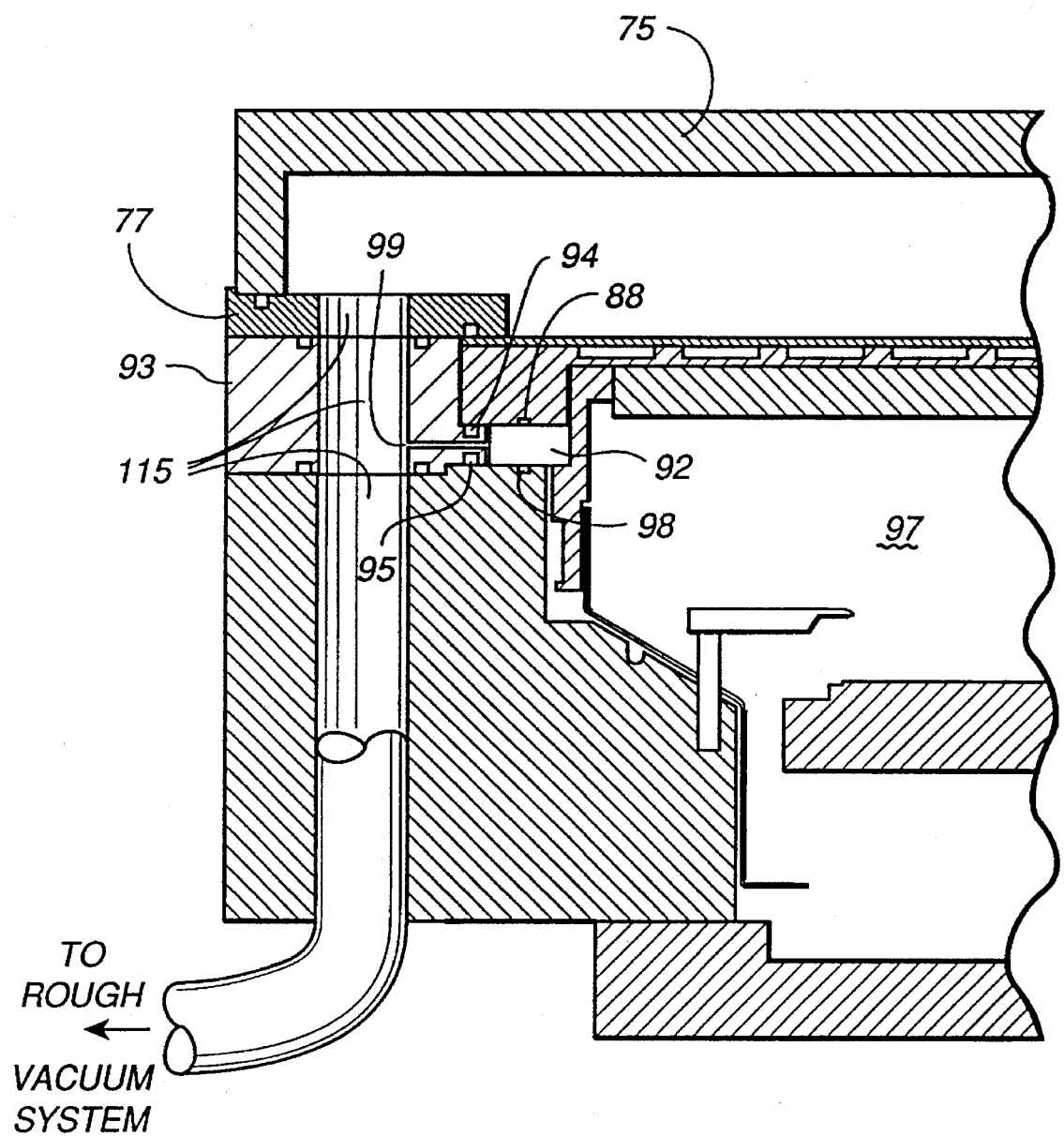
FIG. 9A is a cross sectional detail view of the rough vacuum passage connection to the intermediate seal space around the processing chamber according to the invention.
Figure 12:
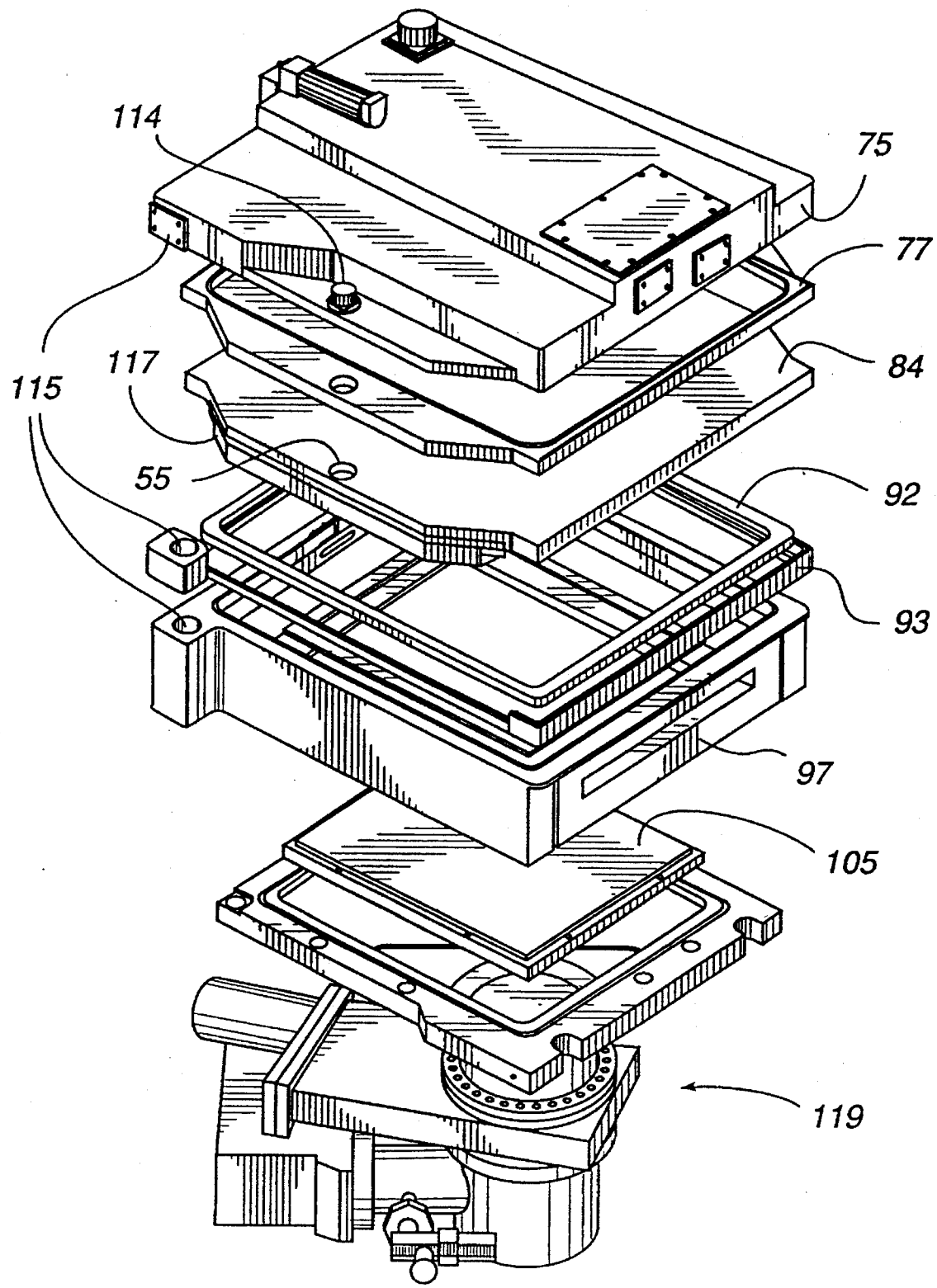
FIG. 12 is an exploded view of an embodiment according to the invention whose cross-section is generally shown in FIG. 9.

FIG. 12 shows an exploded view of the chamber configuration shown in FIGS. 9 and 9A. The target assembly is shown already attached to a cooling fluid manifold 117. In this configuration, this cooling fluid manifold usually made from a non-insulating plastic such as polycarbonate is attached by means of the cooling attachment screw holes to the target assembly 84. Piping having non- insulating properties such as neoprene hoses is attached to this polycarbonate manifold, to circulate a highly resistive, e.g. 200K ohm/in. minimum, cooling fluid. In this configuration a fluid path (hose length) of at least approximately 2 ft in, length prevents large currents from leaking through the cooling fluid to connected machinery.

A power connection for the target plate assembly 114 is configured to intimately connect with the target backing plate through the power connection hole 55. The upper insulator 77 surrounds the top chamber 75.

A rough vacuum connection is routed at the edge and around the process chamber 97 to the top chamber 75 via a rough vacuum passage 115 attached to the outer insulator 93. The magnet sweep mechanism and sensors are separately connected and mounted to the top chamber 75.

The top chamber 75 is supported and sealed against the upper insulator 77 and located by a small flange around the upper insulator's perimeter. A movable magnet 76 (FIG. 9) being manipulated by a magnet sweep device (not shown) produces magnet-enhanced sputtering according to the sweep path of the device. When the processing chamber 97 is evacuated to process conditions (approximately $10^{-8}$ torr) and the upper chamber enclosed by the cap 75 is evacuated to a rough vacuum (e.g. 1 torr) there will be only approximately 1 torr of differential pressure across the target assembly plate. A differential pressure of 1 torr across a target assembly plate having an area of 1 sq. meter will provide a force of approximately 30 lbs. or 13.6 kgs. on the whole of the plate. Compare this to approximately 22,780 lbs. or 10,330 kgs. force that would be experienced if the pressure in the cap were to remain at approximately 1 atmosphere. A force of approximately 23,000 lbs. on a thin target assembly would provide a substantial deflection to the center of the target while in comparison a force of approximately 30 lbs. over the target, even for a relatively thin and large target, would have very little effect. If the pressures in the two chambers were equal there would be no differential pressure across the target at all.

The process chamber 97 and cap top chamber 75 are both initially connected to a rough vacuum (~1 torr) system). When the pressure limits of the rough vacuum subsystem are reached, the process chamber 97 is isolated and a cryogenic vacuum pump is activated to bring the process chamber pressure down to $10^{-8}$ torr. Inert gas, e.g. argon, is then introduced to bathe the substrate and target in argon at a pressure of approximately $10^{-4}$ torr. The top chamber continues to be connected to the rough vacuum system. Conventional methods of increasing and decreasing the pressure differential between chambers can be used to raise or lower the differential. The sputtering target is provided With a back-up (dual seal) sealing means. Vacuum is pulled in the cavity formed by the primary vacuum seal and its back-up seal (differentially pumped seal) in order to improve vacuum pumping of the process chamber. A double seal system is employed to assure a tight seal around the processing chamber 97 and to minimize gas diffusion through the seals. As can be seen in FIG. 9A, the rough vacuum system is connected to the process chamber 97 housing rough vacuum passage 115 running therethrough. The outer insulator 93 vacuum passage includes a between seal vacuum passage 99 to de-pressurize (to the rough vacuum pressure) the space between the O-ring seals around the ceramic (lower) insulator 92. Two 0.09 in. (2.3 mm) holes, for example, can be used for the seal vacuum passage 99. The insulating properties of the polycarbonate outer insulator nearly eliminate the possibility of ionizing the target backing plate before the target is exhausted.

If the erosion of the target due to sputtering is uneven and the center of the target erodes more quickly than the perimeter, as it does according to many magnet sweep patterns, the pressure under the cap 75 can be adjusted to deliberately control the deflection in the center of the target assembly so that the distance between the object being sputtered and the target surface remains generally constant to provide improved chances for uniform sputtering across the surface of the substrate to be sputtered.

FIGS. 10A, 10B, 10C, 10D, and 10E are close-up views of various configurations of the cross-section of target 86. Like numbers identify similar items in different configurations.

FIG. 10A was generally described above when discussing FIGS. 4, 5, and 6. A glass laminate insulating coating 89 covers the back of the cooling cover plate 85.

Figure 10B:
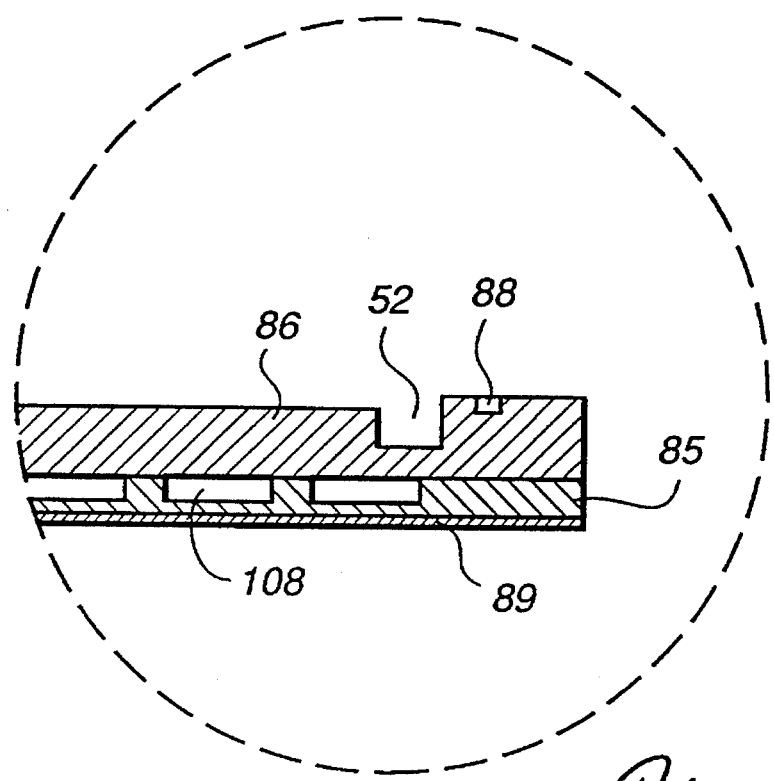
FIG. 10B shows a detailed cross-sectional view of target assembly where the target material is one piece with the target backing plate, according to the invention.

FIG. 10B pictures a monolithic target, similar to FIG. 10A.

Figure 10C:
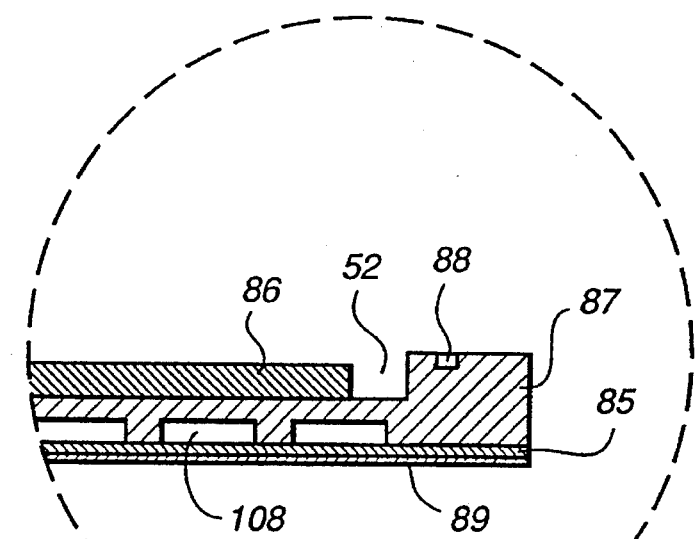

FIG. 10C shows a target 86 securely attached to the target backing plate 87 which has cooling grooves 108 formed therein, the cooling cover plate 85 is a flat sheet bonded to the target backing plate 87. A glass laminate insulator 89 covers the cooling cover plate 85.

Figure 10D:
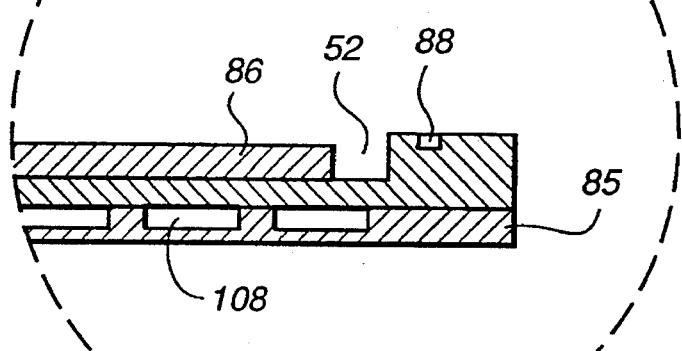
FIG. 10D shows a detailed cross-sectional view of target assembly where cooling cover, plate is made of an insulating material, according to the invention.
Figure 10E:
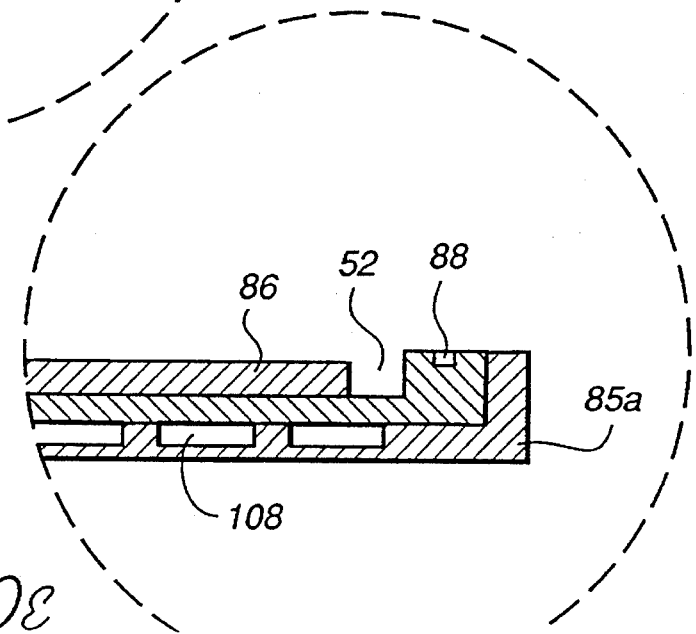
FIG. 10E shows a detailed cross-sectional view of target assembly where cooling cover plate is made of an insulating material which has been formed around the edges of the target backing plate, according to the invention.

FIG. 10D shows the cooling cover plate 85 being made from an insulating prepreg material having cooling grooves 108 therein, thus eliminating the need for a separate glass laminating process. FIG. 10E shows an insulating prepreg material 85a that is formed to wrap around the edges of the target backing plate to partially if not completely eliminate the need for external insulators as previously described.

Figure 11:
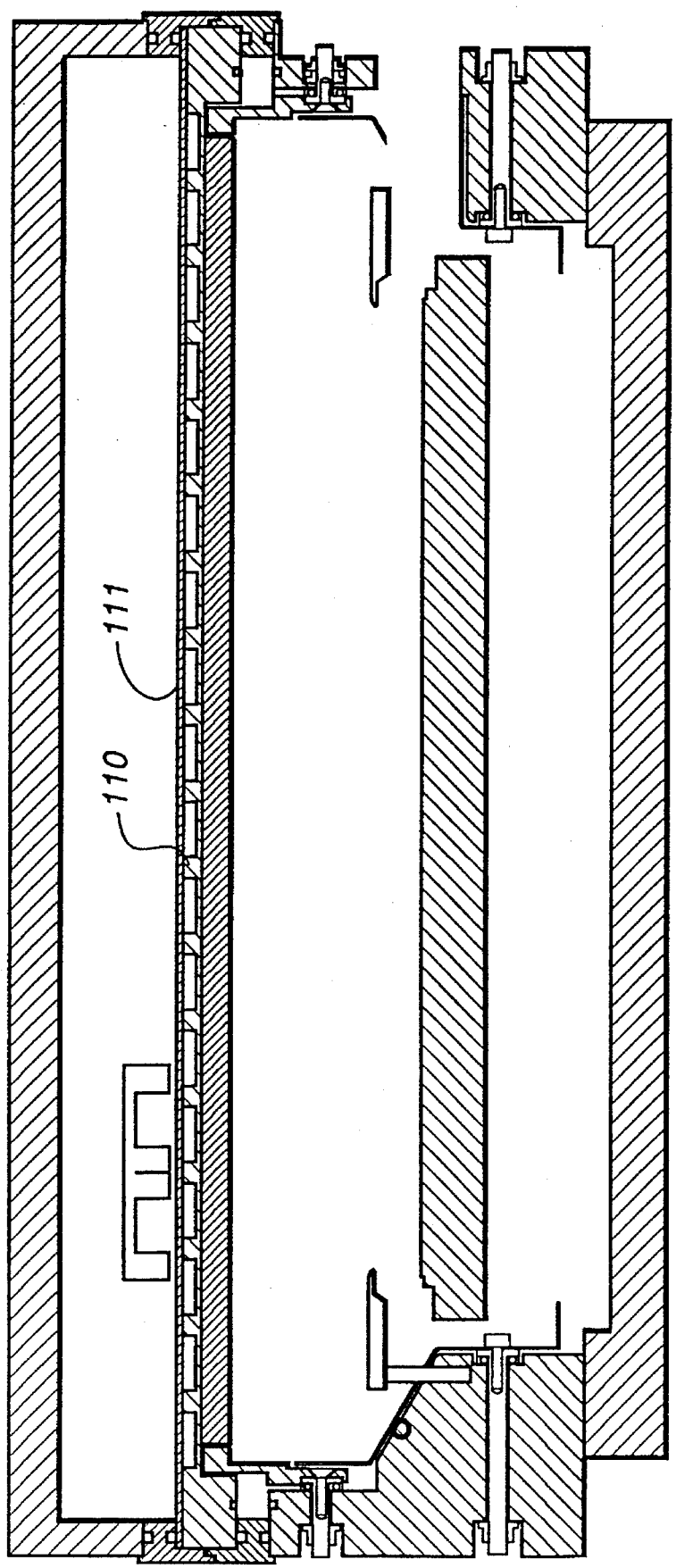
FIG. 11 is a cross-sectional view of a sputtering processing chamber with the target assembly cooling passages contained in the target backing plate and the cover plate being a uniform thickness flat plate.

FIG. 11 shows an alternative embodiment of the target plate assembly, similar to that shown in FIG. 9 except that the target backing plate 110 includes cooling grooves which have previously been shown in the cooling cover plate. In this configuration the cooling cover plate 111 is flat, but is bonded to the target backing plate 110 in the same manner described before. In this configuration the coolant passage connections would be accessed from the top and not the bottom as previously described for the configuration of FIG. 9.

FIG. 12 shows an exploded perspective view of the sputtering device pictured in FIGS. 9 and 9A.

A power connection for the target plate assembly 114 is configured to intimately connect with the target backing plate through the power connection hole 55 (FIG. 12). The upper insulator 77 surrounds top chamber 75.

Figure 13:
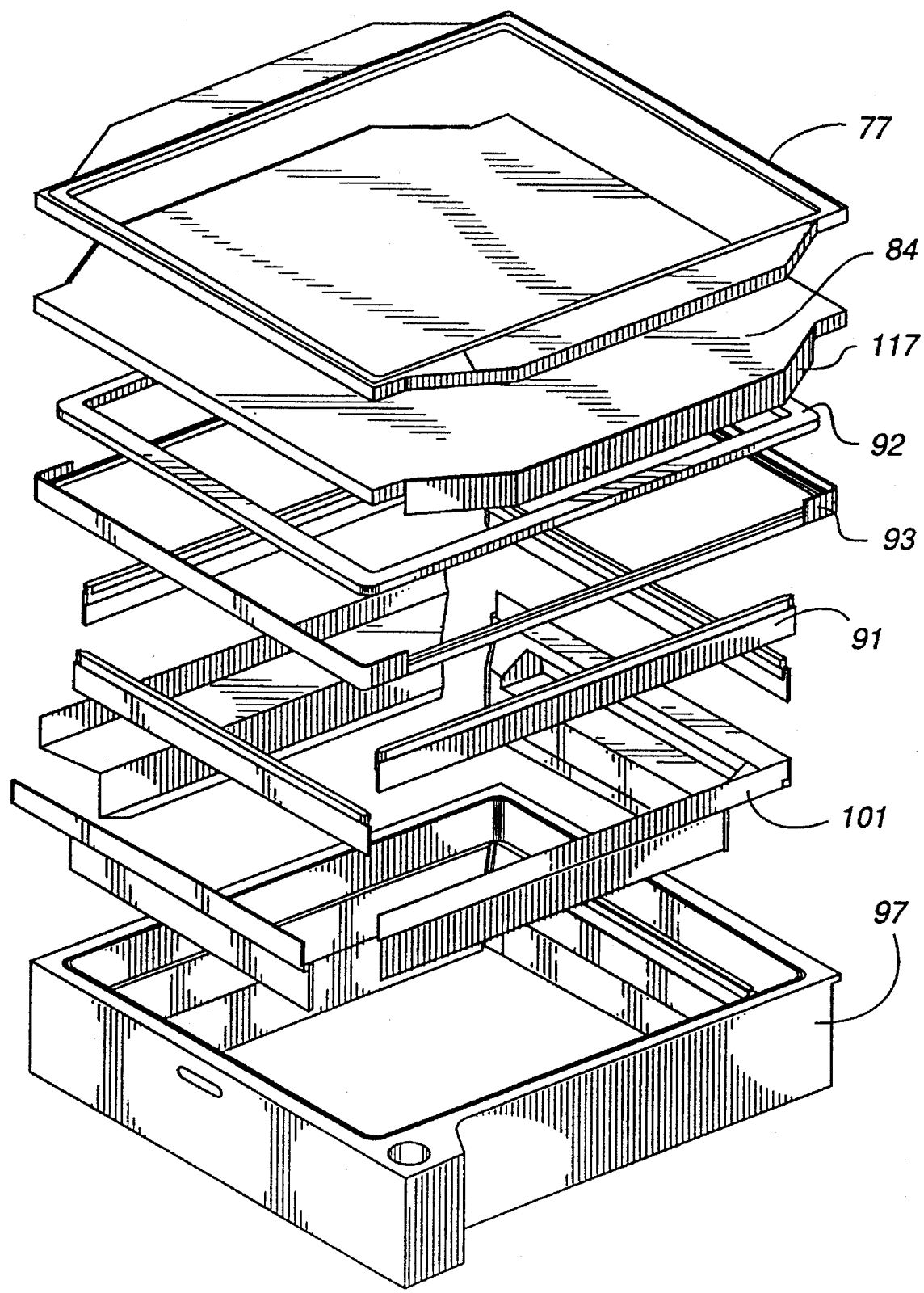
FIG. 13 is an exploded view of the various insulating and process chamber lining pieces of FIGS. 9, 9A, and 12.

FIG. 13 shows the various insulating pieces in an exploded view so that their configuration can be more easily understood. The processing chamber 97 receives the over-spray shield chamber liner 101. The dark space shield 91 fits inside the over-spray shield 101. The outer insulator 93 sits on the top flange of the processing chamber 97 and surrounds the ceramic insulator 92 (the vacuum passage 115 attached to the outer insulator 93 is not shown). The target plate assembly 84 is shown with its cooling fluid manifold 117 in place. The upper insulator 77 is shown disposed above the target assembly 84. In FIG. 13, various pieces are shown in two or more sections. These pieces may be constructed as one or more pieces in their final configuration, depending on manufacturing considerations.

Figure 14:
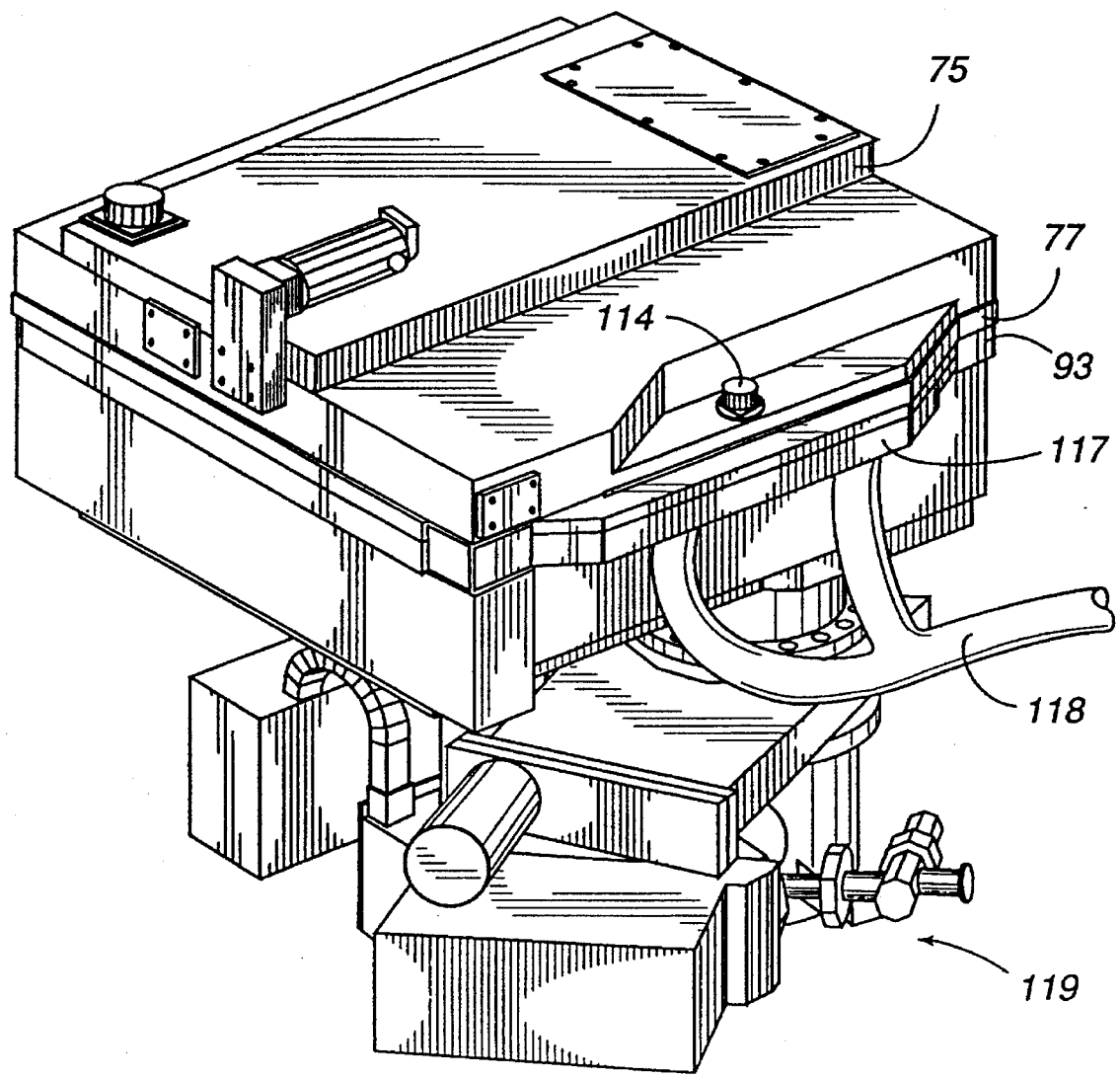
FIG. 14 shows a perspective view of the outside of a process chamber according to the invention as might be observed when the exploded parts as shown in FIG. 12 are assembled.

FIG. 14 shows an assembled device according to the invention such that the exploded view of FIG. 12 is now assembled. A cooling fluid hose 118 is shown connected to the cooling fluid manifold 117, which can be made part of the outer insulator 93. The outer insulator 93 is shown adjacent to the upper insulator 77, both of which enclose the target assembly 84 (not shown here) to prevent anyone from contacting the energized target assembly. The power connection 114 for the target plate assembly is shown adjacent to the top chamber cap 75.

Figure 15:
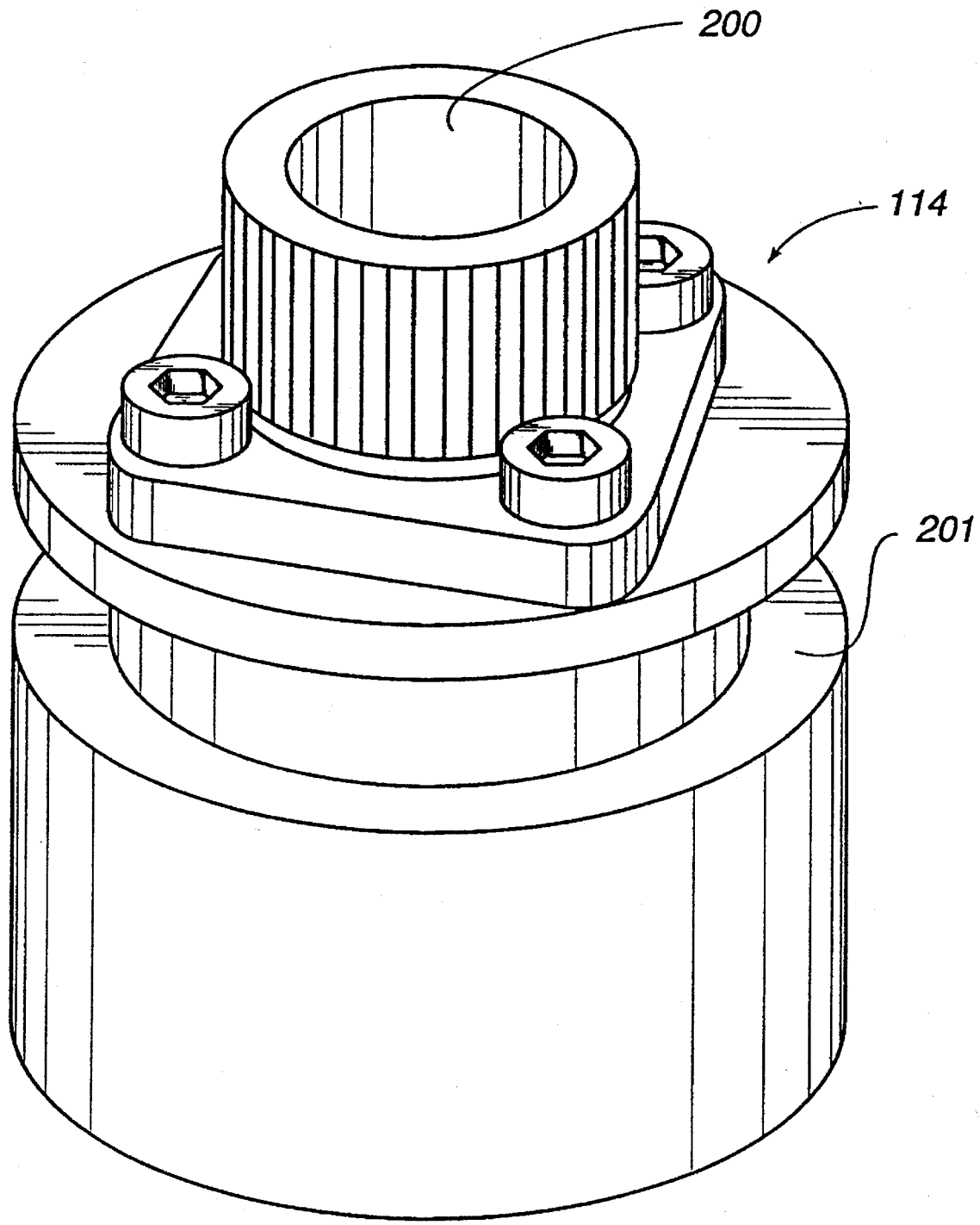
FIG. 15 is a perspective view of a power connector fitting, according to the invention.
Figure 16:
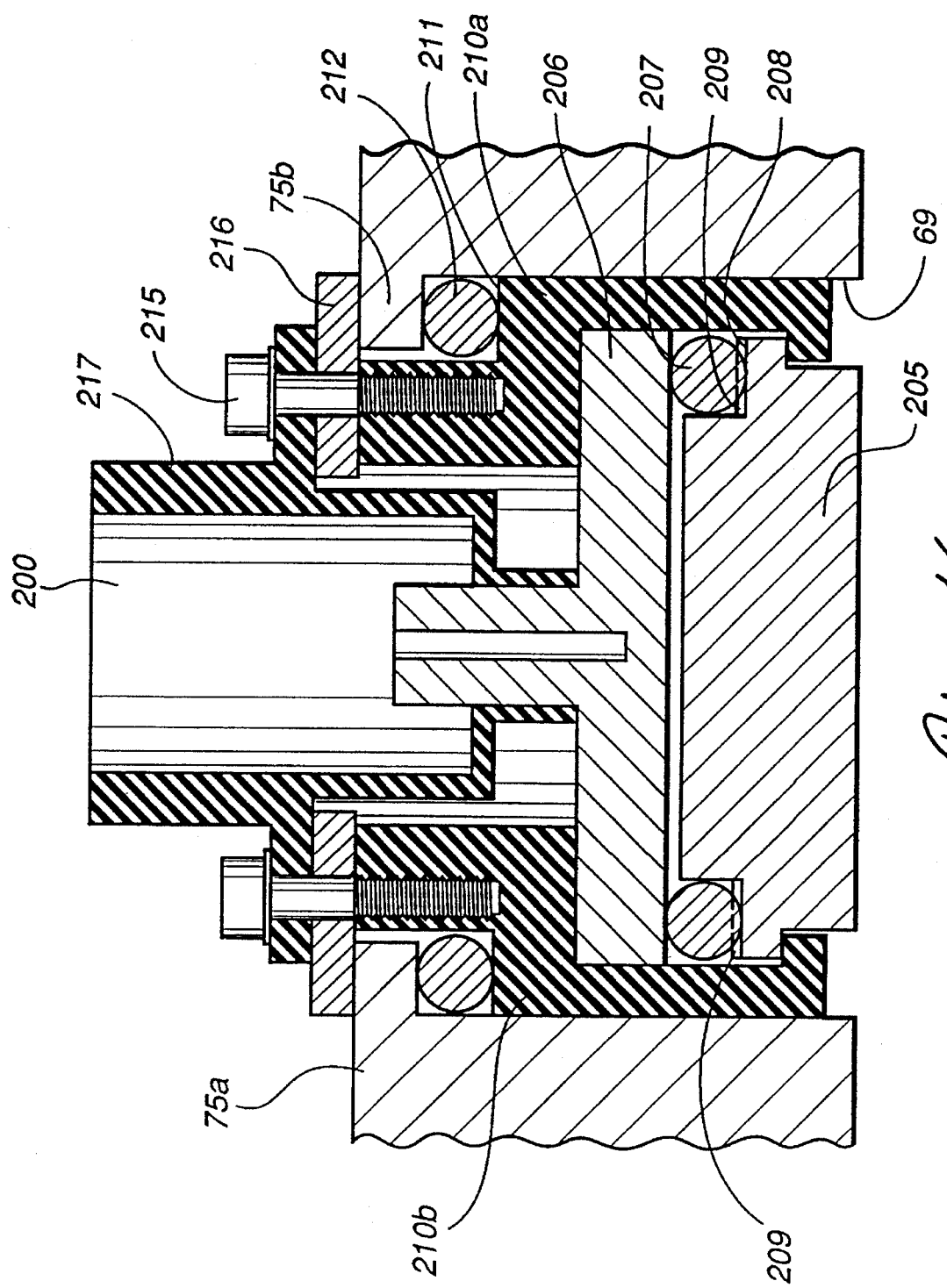
FIG. 16 shows a cross sectional view of the power connector fitting, according to the invention.

FIG. 15 shows a perspective view of the safety power connector assembly 114 used to connect electrical power to the target backing plate. The power cable (not shown) is connected into the top opening 200. A circumferential groove 201 mates with the edge of the counterbore of the top chamber flange 75a (FIG. 16). The cross-section of the power connection assembly and its flange connection is shown in FIG. 16. A safe contact 205 sits adjacent to the target assembly in the power connection opening 55. A live contact 206 is separated from the safe contact by a lower O-ring 207. The lower O-ring 207 does not lay flat on the safe contact's outer ledge 208 but is supported by several fins 209 (for example four) spaced around the perimeter of the ledge 208. Under ambient conditions the live contact is separated from the safe contact by approximately 0.030 inches. Two halves of an outer casing 210a, 210b, for example made of polycarbonate, encircle and capture the O-ring 207 and the live and safe contacts 206, 205. An upper O-ring 212 is located on the upper ledge 211 of the outer casings 210a, b and the assembly is slipped from the bottom into the electrical connecting bore 69 of the top chamber flange 75a. A counter bore lip 75b of the top chamber flange 75a retains the assembly 205, 206, 207. A retaining screw and plate 215, 216 secure the assembly to the flange 75a. An end piece 217 (polycarbonate or a commercially available electrical connector) protects the central power feed from the surrounding objects and persons. The power feed wire (not shown) contacts directly with the live contact 206. The live contact 206, safe contact 205 and O-ring 207 are floating in the casing 210a, 210b.

Under ambient conditions the live contact is energized but the safe contact is not as it is separated from the live contact by the O-ring 207. When a vacuum is pulled in the top chamber 75, the top chamber flange 75a moves down, pressurizing the full contact O-ring 212 pressing the casing 210a,b down. Once the safe contact is firmly seated on the target it can travel no further. Further movement (normal under vacuum) of the casing causes the lower O-ring 207 to be compressed over the raised fins 209 (e.g., 10–15 lbs. resistance) causing the live and safe contacts to meet resulting in an electrical connection. When the target is not fully enclosed by the insulators (as discussed elsewhere) it cannot be energized, because the absence of a tight seal will prevent a vacuum from being formed. Therefore the top chamber can be handled safely (albeit carefully) without any live electrical terminals exposed.

Securing the connection between the target and target backing plate can be done by diffusion bonding.

Figure 17:
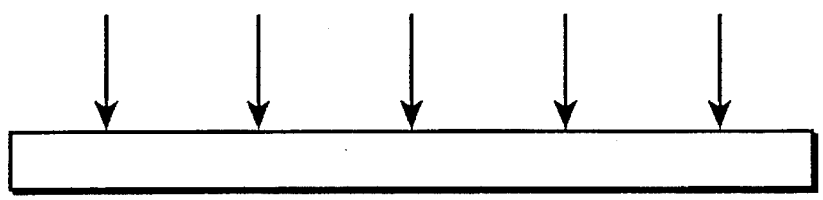
FIG. 17 shows a schematic view of diffusion bonding a target and a target backing plate according to the invention.
Figure 17:
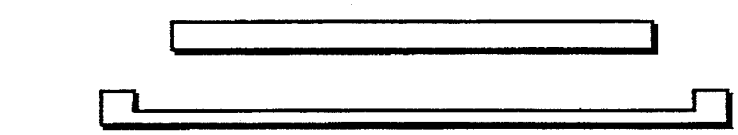
Figure 17:
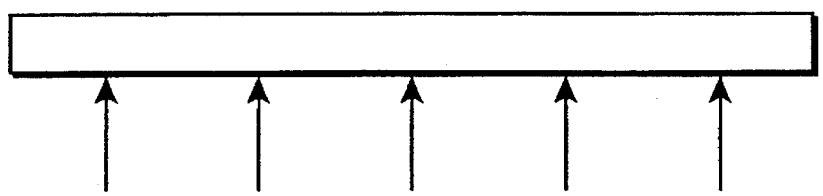

When performing diffusion bonding of tantalum to a titanium backing plate, the following process may be followed. The surfaces to be bonded are polished with No. 600 emery paper to a ground finish of 0.1 μm and just before bonding the surfaces are chemically cleaned following The American Society for Metals (ASM) procedures for etching both titanium and tantalum. The tantalum should be pressed (as shown for example in FIG. 17) to the titanium at 2 MPa (290 psi) while heating the assembly to 750° C. The assembly temperature should be increased to 875° C. and 885° C. while maintaining the contact pressure at temperature for 60 minutes.

For superior bond quality, the following steps should be followed: The surfaces to be bonded are polished with No. 600 emery paper to a ground finish of 0.1 μm and just before bonding the surfaces are chemically cleaned following The American Society for Metals (ASM) procedures for etching both titanium and tantalum. The tantalum is pressed to the titanium at 50 MPa while heating the assembly to 750° C. The assembly temperature is then increased to 875° to 885° C. for 1 hour while maintaining a contact pressure of 5 MPa. During cooling the load should also be maintained. All diffusion bonds must be done in either an inert gas atmosphere or under vacuum ($10^{-3}$ to $10^{-4}$ Torr).

High strength bonds of titanium to titanium or titanium to Ti/6A1/4V bonds can be achieved by heating the plates to 850° C. (1562° F.) while holding them together at 100 psi for at least two hours. In this way pure titanium (target material) can be diffusion bonded to a backing plate of commercially pure grade titanium (e.g., CP Grade 2) or to Ti/6A1/4V. (Ti/6A1/4V is also available in Extra Low Interstitial or ELI oxygen to improve the bond quality). Preparation of the titanium bond surfaces are the same as those described for tantalum-to-titanium bonds, likewise, bonds must be done in either an inert gas atmosphere or under vacuum. Following the diffusion bonding manufacturing step, the cooling cover plate can be epoxy-bonded to the back of the backing plate. An insulating sheet of G-11 glass epoxy laminate may be bonded concurrently over the cooling cover plate or may be bonded over the cover plate at a later time.

Figure 18:
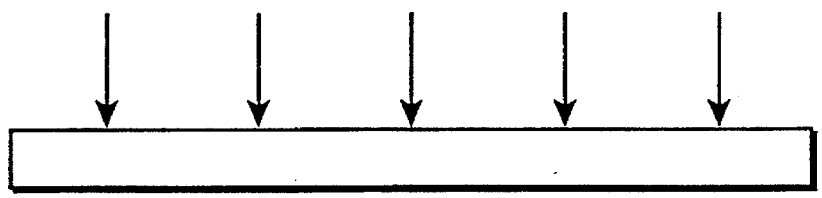
FIG. 18 shows a schematic view of diffusion bonding a target, a target backing plate, and a cooling cover plate according to the invention.
Figure 18:
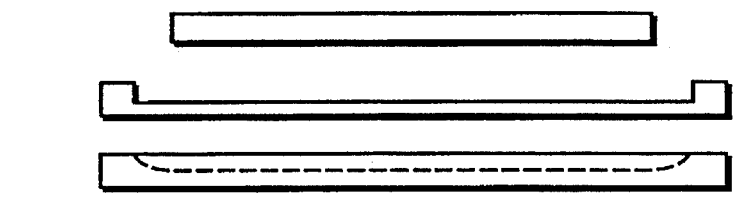
Figure 18:
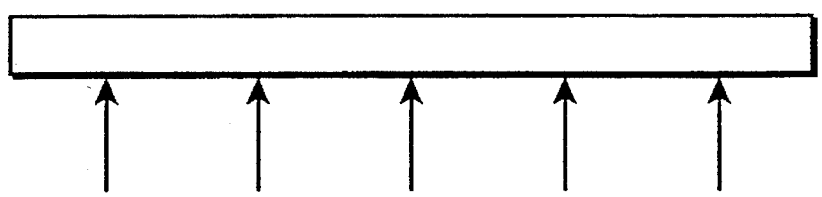

If the cooling cover plate is made of commercially pure titanium or Ti/6A1/4V, it is also possible to diffusion bond the cooling cover plate to the target backing plate by diffusion bonding, for example as shown in FIG. 18. A superior watertight quality bond is obtained by holding the plates at 4 MPa (580 psi) while heating to 850° C. (1562° F.) at a rate of 0.4° C./sec (0.7° F./sec), holding for 90 to 100 minutes at 4 MPa, and slowly cooling at a rate of 0.1° C./sec (0.18° F./sec). The diffusion bonding then takes place at the same time as bonding of the pure titanium target to its backing plate. An insulating sheet of G-11 glass epoxy laminate, if required, can be bonded over the cover plate at a later time.

Aluminum can also be diffusion bonded. A difficulty with diffusion bonding of aluminum is that pure aluminum, upon exposure to an oxygen containing environment immediately reacts with the oxygen to form an aluminum oxide layer on the surface of the aluminum. This aluminum oxide layer is chemically very stable and is generally impervious to diffusion bonding. However, if the aluminum oxide layer is removed or reduced by scratched-brushing or other mechanical or chemical means in an inert gas atmosphere, the removal or reduction provides a greater surface roughness and access to the underlying aluminum to facilitate diffusion bonding.

The target assembly is then pressurized to approximately 500 psi and diffusion bonded by raising the target assembly's temperature to approximately 420° C. for approximately 4 hours. The diffusion resistance of aluminum oxide is reduced or avoided by the surface removal or treatment in an inert gas environment.

Similarly, a titanium-to-tantalum, tantalum-to-aluminum and titanium-to-aluminum bond can be created by diffusion bonding or a diffusion-like brazing process.

The target assembly is provided with a sealing means such that a vacuum may be pulled from both the process chamber side and a magnetron chamber side of the target assembly. The process/deposition parameters such as magnetron electrical impedance, substrate film thickness uniformity, etc. can be controlled somewhat using two chambers. The target assembly deflection can be controlled by varying the pressure between the two chambers. The target configuration as described provides no welds or other joints separating the cooling passages from the process chamber. There are no welds exposed to vacuum and therefore the possibility of leaks through defects in joints is completely eliminated apart from leaks from defects in materials. The sputtering target assembly and its cooling system are self-contained and upon target assembly replacement or removal, there is no water dripping or contamination of the sputtering chamber since its design consists of a self-contained heat exchanger. When the cooling fluid passing through its passages is at a temperature higher than the surroundings, the target assembly is warmed to reduce or accelerate out-gassing of the target (reducing this effect during processing, and eliminating condensation on the surface of the target assembly surfaces). There is no coolant to vacuum seal in any of these configurations. A sputtering target assembly of this configuration can be of a large size and a low profile. Such an assembly even if much larger than the current design, will deflect negligibly under vacuum applied nearly equally from both sides.

The sputtering target assembly may have its cooling cover plate made of a non-electrically conducting material such as glass epoxy laminates (G-10 or G-11/FR4) or prepreg formed. This non-electrically conducting material can be joined to the target backing plate- using a suitable low curing-temperature and pressure adhesive, such as structural-type epoxies. The non-electrically conducting cooling cover plate/heat exchanger material can be configured to completely surround all exposed sides of the target to ensure electrical safety for operators.

The advantages of this device over the prior art include, once assembled, a one-piece target assembly which is interchangeable with other target assemblies without the danger of any cooling liquid being spilled into the sputtering-processing chamber. When large areas are to be sputtered and the larger processing and magnetron/pressure equalizing chambers are provided there is controllable or no deflection of the target assembly due to pressure differential across the target assembly. The pressure of cooling liquid in the assembly is contained in the cooling passages by various securing techniques, including adhesive gluing the target backing plate to the cover plate or by various diffusion bonding techniques, brazing with or without mechanical fastening assistance. When properly done, there is virtually no possibility of coolant leakage in spite of the fact that differential pressure through and across the cooling passages is expected to reach several atmospheres when the cooling fluid is pressurized. Heat exchanger coolant passages can easily be re-designed to optimize the cooling temperature distribution as desired and based on empirical data.

While the invention has been described with regard to specific embodiments, those skilled in the art will recognize that changes can be made in form and detail without departing from the spirit and scope of the invention. For example, the evaluations described here are merely representative of the invention and should not be considered to limit the scope of the invention to the method or structure herein described.

We claim:

1. A method of producing a sputtering target assembly comprising the steps of:

preparing the surface of a tantalum target for bonding;

preparing the surfaces of a titanium backing plate for bonding;

placing the tantalum surface to be bonded in contact with the titanium surface to be bonded;

placing the surfaces to be bonded in an inert gas or vacuum environment;

pressing the bonding surfaces against one another at approximately 2 MPa, while simultaneously heating the surfaces to be bonded to approximately 750° C.;

heating the surfaces to be bonded to approximately 885° C. for approximately one hour; and maintaining the pressure on the bonding surface during cooling.

2. A method of producing a sputtering target assembly comprising the steps of:

preparing the surface of a titanium or titanium alloy target for bonding;

preparing the surface of a titanium backing plate for bonding;

placing the titanium target surface to be bonded in contact with the titanium backing plate surface to be bonded;

placing the surfaces to be bonded in an inert gas or vacuum environment; and pressing the bonding surfaces against one another at approximately 100 psi, while simultaneously heating the surfaces to be bonded to approximately 850° C. approximately two hours.

3. A method of producing a sputtering target assembly comprising the steps of:

preparing a titanium target material surface for diffusion bonding;

placing said titanium target material and an aluminum or aluminum alloy backing plate in an oxygen-free environment;

preparing said aluminum or aluminum alloy plate material for diffusion bonding;

placing the target material surface prepared for bonding in contact with the target backing plate surface prepared for bonding;

providing a load to press the target against the target backing plate while creating a pressure of approximately 500 psi with a temperature of 420° C. for at least approximately 4 hours.

* * * * *